(12) United States Patent
Burtovyy et al.

(10) Patent No.: US 11,795,285 B2
(45) Date of Patent: Oct. 24, 2023

(54) DUAL UV BLOCKERS CONTAINING STABLE PHOTOACTIVE MASS POLYMERIZABLE POLYCYCLOOLEFIN COMPOSITIONS AS OPTICAL MATERIALS

(71) Applicants: PROMERUS, LLC, Akron, OH (US); MERCK PATENT GMBH, Darmstadt (DE)

(72) Inventors: Oleksandr Burtovyy, Akron, OH (US); Pawel Miskiewicz, Darmstadt (DE); Hyun-Jin Yoon, Pyeongtaek-shi (KR); Patrick Schellin, Darmstadt (DE); Manuel Hamburger, Darmstadt (DE)

(73) Assignees: Promerus, LLC, Akron, OH (US); Merck Patent GmbH, Darmstadt (DE)

( * ) Notice: Subject to any disclaimer, the term of this patent is extended or adjusted under 35 U.S.C. 154(b) by 0 days.

(21) Appl. No.: 18/070,538

(22) Filed: Nov. 29, 2022

(65) Prior Publication Data

US 2023/0167256 A1 Jun. 1, 2023

Related U.S. Application Data

(60) Provisional application No. 63/283,824, filed on Nov. 29, 2021.

(51) Int. Cl.
*C08J 5/18* (2006.01)
*C08F 4/82* (2006.01)
(Continued)

(52) U.S. Cl.
CPC ............... *C08J 5/18* (2013.01); *B33Y 70/00* (2014.12); *C08F 4/82* (2013.01); *C08F 132/08* (2013.01);
(Continued)

(58) Field of Classification Search
CPC . C08J 5/18; C08J 2345/00; C08F 4/82; C08F 132/08; C08F 2410/01;
(Continued)

(56) References Cited

U.S. PATENT DOCUMENTS

2017/0306171 A1 10/2017 Vidavsky et al.
2021/0025226 A1* 1/2021 Shouhi ............. B32B 17/10504
(Continued)

FOREIGN PATENT DOCUMENTS

JP 2021/031542 A 3/2021
JP 2021031542 A * 3/2021 ............ C08F 293/00
(Continued)

OTHER PUBLICATIONS

Chemical abstract compound, STNext, RN 2586056-16-6, Feb. 10, 2021.
(Continued)

*Primary Examiner* — Bijan Ahvazi
(74) *Attorney, Agent, or Firm* — Balaram Gupta

(57) ABSTRACT

Embodiments in accordance with the present invention encompass compositions encompassing a latent organoruthenium compound, a photosensitizer, one or more monomers which undergo ring open metathesis polymerization (ROMP) and at least two distinct types of UV blockers, where when said composition is exposed to suitable actinic radiation forms a substantially transparent film or a three dimensional object. Surprisingly, the compositions are very stable at ambient conditions to temperatures up to 80° C. for several weeks and undergo mass polymerization only when subjected to actinic radiation under inert atmosphere such as for example a blanket of nitrogen. Accordingly, compositions of this invention are useful in various opto-electronic applications, including as 3D printing materials, coatings, encapsulants, fillers, leveling agents, among others.

20 Claims, 1 Drawing Sheet

(51) Int. Cl.
  *C09D 4/00* (2006.01)
  *C09D 5/32* (2006.01)
  *B33Y 70/00* (2020.01)
  *C08F 132/08* (2006.01)
  *C08K 5/3475* (2006.01)
  *C09D 145/00* (2006.01)
  *H10K 50/844* (2023.01)

(52) U.S. Cl.
  CPC .............. *C08K 5/3475* (2013.01); *C09D 4/00* (2013.01); *C09D 5/32* (2013.01); *C09D 145/00* (2013.01); *C08F 2410/01* (2013.01); *C08J 2345/00* (2013.01); *H10K 50/844* (2023.02)

(58) Field of Classification Search
  CPC .......... C08K 5/3475; C09D 4/00; C09D 5/32; C09D 145/00; B33Y 70/00; H01L 51/5253
  See application file for complete search history.

(56) References Cited

U.S. PATENT DOCUMENTS

2021/0221931 A1\* 7/2021 Burtovyy ............ C07F 15/0046
2021/0380743 A1 12/2021 Himizu et al.

FOREIGN PATENT DOCUMENTS

WO   WO 2019/147878 A1   8/2019
WO   WO-2019147878 A1 \*   8/2019   .......... B01J 31/2273

OTHER PUBLICATIONS

Written Opinion of the ISA: PCT/US2022/051123, dated Apr. 4, 2023.

\* cited by examiner

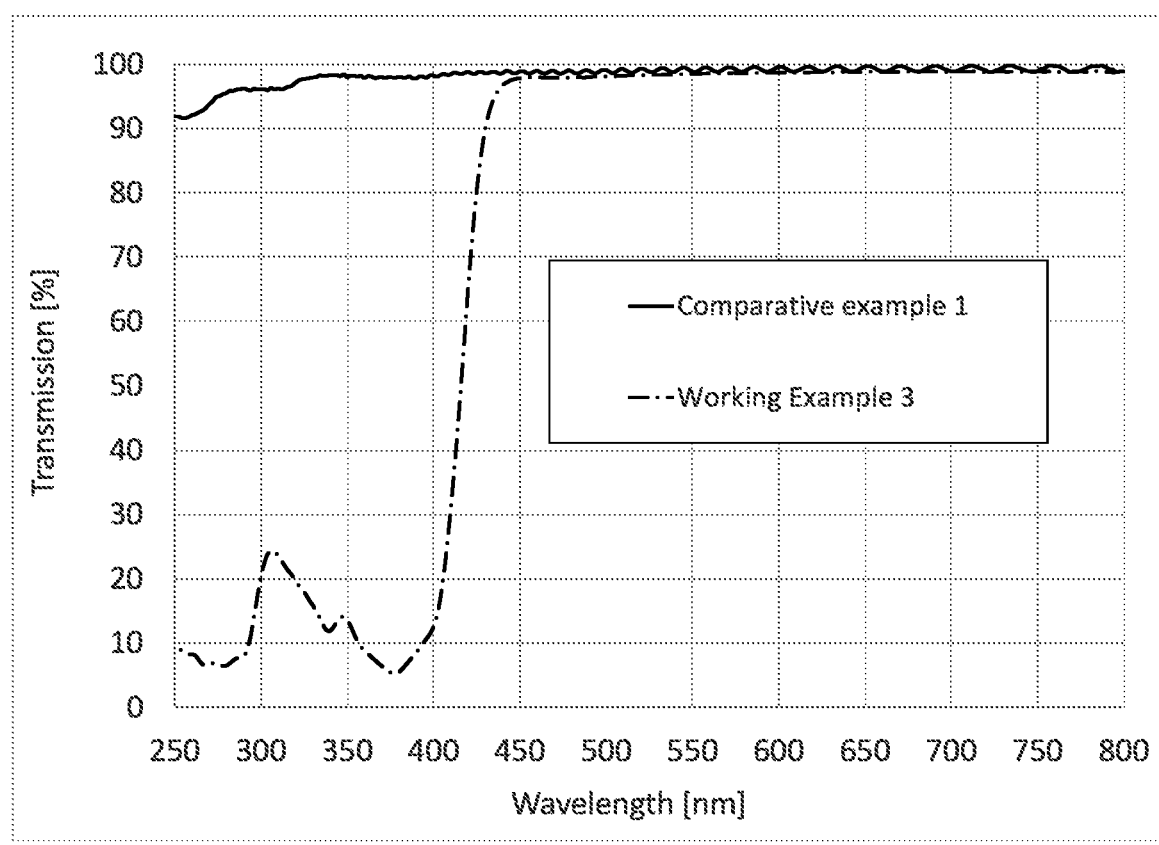

DUAL UV BLOCKERS CONTAINING STABLE PHOTOACTIVE MASS POLYMERIZABLE POLYCYCLOOLEFIN COMPOSITIONS AS OPTICAL MATERIALS

CROSS REFERENCE TO RELATED APPLICATIONS

This application claims the benefit of U.S. Provisional Application No. 63/283,824, filed Nov. 29, 2021, which is incorporated herein by reference in its entirety.

BACKGROUND OF THE INVENTION

Field of the Invention

Embodiments in accordance with the present invention relate generally to a long shelf stable, single component mass polymerizable polycycloolefin monomer compositions containing a latent organo-ruthenium compound and certain ultraviolet (UV) light blockers, which rapidly undergo mass polymerization via ring open metathesis polymerization methods when subjected to suitable photolytic conditions. Specifically, the compositions of this invention exhibit long storage stability even up to several months at temperatures ranging from ambient temperature to 80° C. especially when stored in inert and dark atmosphere, and undergo rapid mass polymerization only when subjected to suitable actinic radiation to form transparent optical layers having utility in a variety of opto-electronic applications including as 3D printing materials, encapsulants, coatings, and fillers. More specifically, this invention relates to single component stable compositions encompassing norbornene (NB) based olefinic monomers and two or more UV blockers, which have high optical transparency and exhibit desirable properties for fabricating devices, such as optical sensors, light emitting diodes (LEDs), organic light emitting diodes (OLED), 3D printing materials, among other devices.

Description of the Art

Organic light emitting diodes (OLEDs) are gaining importance in a variety of applications, including flat panel televisions and other flexible displays, among other applications. However, conventional OLEDs, particularly, bottom emitting OLEDs suffer from a drawback in that only about half of the generated photons are emitted into the glass substrate out of which 25% are extracted into air. The other half of the photons are wave-guided and dissipated in the OLED stack. This loss of photons is primarily attributed to the refractive index (n) mismatch between the organic layers (n=1.7-1.9) and the glass substrate (n=1.5). By matching the refractive index of the substrate (n=1.8) and organic layers and augmenting the distance of the emission zone to the cathode to suppress plasmonic losses light extraction into the substrate can be increased to 80-90%. See, for example, G. Gaertner et al., Proc. Of SPIE, Vol. 6999, 69992T pp 1-12 (2008).

In addition, OLEDs also pose other challenges; in that OLEDs being organic materials, they are generally sensitive to moisture, oxygen, temperature, and other harsh conditions. Thus, it is imperative that OLEDs are protected from such harsh atmospheric conditions. See for example, U. S. Patent Application Publication No. US2012/0009393 A1.

Furthermore, such OLED devices are generally encapsulated with optically transparent insulating materials having low dielectric constant (Dk) and low-loss, also referred to as dielectric dissipation factor, (Df). Generally, in most of such devices the insulating materials that are suitable must have dielectric constant lower than 3 and low-loss lesser than 0.001 at high frequencies such as for example greater than 50 GHz. Also, there is an increased interest in developing organic dielectric materials as they are easy to fabricate among other advantages.

In order to address some of the issues faced by the art, U.S. Pat. No. 8,263,235 discloses use of a light emitting layer formed from at least one organic light emitting material and an aliphatic compound not having an aromatic ring, and a refractive index of the light emitting from 1.4 to 1.6. The aliphatic compounds described therein are generally a variety of polyalkyl ethers, and the like, which are known to be unstable at high temperatures, see for example, Rodriguez et al., I & EC Product Research and Development, Vol. 1, No. 3, 206-210 (1962).

U.S. Pat. No. 9,944,818 discloses a two component mass polymerizable composition which is capable of tailoring to the desirable refractive index and is suitable as a filler and a protective coating material, thus potentially useful in the fabrication of a variety of OLED devices.

Accordingly, there is still a need for filler materials that complement the refractive index of OLEDs and yet exhibit high transparency, low dielectric constant and good thermal properties, among other desirable properties. In addition, it is desirable that such organic filler materials readily form a permanent protective coatings and are available as a single component composition for dispensing with such OLED layers or in a vat 3D printing operations.

Thus, it is an object of this invention to provide compositions that overcome the gaps faced by the art. More specifically, it is an object of this invention to provide a single component composition that will mass polymerize under the conditions of the fabrications of 3D printing and/or fabrications of an OLED device. It is further an object of this invention to provide stable single component mass polymerizable composition with no change in viscosity at or below normal storage conditions, including up to a temperature of about 80° C. but which undergoes mass polymerization only under the process conditions in which the 3D object or an OLED device is finally fabricated, such as for example by the use of radiation.

Other objects and further scope of the applicability of the present invention will become apparent from the detailed description that follows.

SUMMARY OF THE INVENTION

Surprisingly, it has now been found that by employing a combination of two or more UV light blocking compounds and a suitable organo-ruthenium compound as a latent catalyst as described herein, and in combination with one or more olefinic monomers and a suitable photoactive agent, it is now possible to fabricate a 3D object or an OLED device having a transparent optical layer which features hitherto unachievable properties, i.e., refractive index in the range of 1.4 to 1.8 or higher, high colorless optical transparency, dielectric constant less than 2.5, desirable film thickness of the filler layer typically in the range of 5 to 20 μm but can be tailored to lower or higher film thickness depending upon the intended application, compatible with the OLED stack, particularly the cathode layer (a very thin layer on the top of the OLED stack), compatible with polymerization of the formulation on the OLED stack, including fast polymerization time and can be photolytically treated, adhesion to both OLED stack and glass cover, and the like. The polymerization speeds can be less than five seconds per layer especially when used in 3D printing devices. It is also important to note that the compositions of this invention are expected to exhibit good uniform leveling across the OLED layer which typically requires a low viscosity. Further, compositions of this invention are also expected to exhibit low shrinkage due to their rigid polycycloolefinic structure. In addition, as the components of this invention undergo fast mass polymerization upon application they do not leave behind any fugitive small molecules which can damage the OLED stack. Generally, no other small molecule additives need to be employed thus offering additional advantages. Most importantly, the compositions of this invention are stable (i.e., no change in viscosity) at ambient atmospheric conditions including up to 80° C. for several hours to several days, especially when kept under inert conditions, and undergo mass polymerization only upon UV exposure. Most importantly, the compositions of this invention exhibit excellent shelf life stability in that the compositions of this invention retain their initial viscosity for several days, at least five to ten days, and generally longer than thirty (30) days to several months.

Advantageously, the compositions of this invention are also compatible with a "one drop fill" (commonly known as "ODF"). In a typical ODF process, which is commonly used to fabricate a top emission OLED device, a special optical fluid is applied to enhance the transmission of light from the device to the top cover glass, and the fluid is dispensed by an ODF method. Although the method is known as ODF which can be misleading because several drops or lines of material are generally dispensed inside the seal lines. After applying the fluid, the fluid spreads out as the top glass is laminated, analogous to die-attach epoxy. This process is generally carried out under vacuum to prevent air entrapment. The present invention allows for a material of low viscosity which readily and uniformly coats the substrate with rapid flow in a short period of time. Even more advantageously, the present invention overcomes the deficiencies faced by the prior art in that a single component composition is much more convenient than employing a two component system especially in an ODF method. Furthermore, the composition of the invention when used in accordance with the process conditions as provided herein provides more transparent 3D objects having good mechanical and thermal properties.

BRIEF DESCRIPTION OF THE DRAWINGS

Embodiments in accordance with the present invention are described below with reference to the following accompanying figures and/or images. Where drawings are provided, it will be drawings which are simplified portions of various embodiments of this invention and are provided for illustrative purposes only.

FIG. 1 shows UV-Vis transmission spectra of films prepared according to the description in the working examples.

DETAILED DESCRIPTION

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, "hydrocarbyl" refers to a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "alkyl" means a saturated, straight-chain or branched-chain hydrocarbon substituent having the specified number of carbon atoms. Particular alkyl groups are methyl, ethyl, n-propyl, isopropyl, n-butyl, iso-butyl, tert-butyl, and so on. Derived expressions such as "alkoxy", "thioalkyl", "alkoxyalkyl", "hydroxyalkyl", "alkylcarbonyl", "alkoxycarbonylalkyl", "alkoxycarbonyl", "diphenylalkyl", "phenylalkyl", "phenylcarboxyalkyl" and "phenoxyalkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "perhaloalkyl" represents the alkyl, as defined above, wherein all of the hydrogen atoms in said alkyl group are replaced with halogen atoms selected from fluorine, chlorine, bromine or iodine. Illustrative examples include trifluoromethyl, trichloromethyl, tribromomethyl, triiodomethyl, pentafluoroethyl, pentachloroethyl, pentabromoethyl, pentaiodoethyl, and straight-chained or branched heptafluoropropyl, heptachloropropyl, heptabromopropyl, nonafluorobutyl, nonachlorobutyl, undecafluoropentyl, undecachloropentyl, tridecafluorohexyl, tridecachlorohexyl, and the like. Derived expression, "perhaloalkoxy", is to be construed accordingly. It should further be noted that certain of the alkyl groups as described herein, such as for example, "alkyl" may partially be fluorinated, that is, only portions of the hydrogen atoms in said alkyl group are replaced with fluorine atoms and shall be construed accordingly.

As used herein the expression "acyl" shall have the same meaning as "alkanoyl", which can also be represented structurally as "R—CO—," where R is an "alkyl" as defined herein having the specified number of carbon atoms. Additionally, "alkylcarbonyl" shall mean same as "acyl" as defined herein. Specifically, "($C_1$-$C_4$)acyl" shall mean formyl, acetyl or ethanoyl, propanoyl, n-butanoyl, etc. Derived expressions such as "acyloxy" and "acyloxyalkyl" are to be construed accordingly.

As used herein, the expression "aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art.

As used herein, the expression "arylalkyl" means that the aryl as defined herein is further attached to alkyl as defined herein. Representative examples include benzyl, phenylethyl, 2-phenylpropyl, 1-naphthylmethyl, 2-naphthylmethyl and the like.

As used herein, the expression "alkenyl" means a non-cyclic, straight or branched hydrocarbon chain having the specified number of carbon atoms and containing at least one carbon-carbon double bond, and includes ethenyl and straight-chained or branched propenyl, butenyl, pentenyl, hexenyl, and the like. Derived expression, "arylalkenyl" and five membered or six membered "heteroarylalkenyl" is to be construed accordingly. Illustrative examples of such derived expressions include furan-2-ethenyl, phenylethenyl, 4-methoxyphenylethenyl, and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolinyl, benzimidazolyl, indazolyl, pyridofuranyl, pyridothienyl, and the like radicals.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $(C_1-C_6)$alkyl, $(C_2-C_6)$alkenyl, $(C_1-C_6)$perfluoroalkyl, phenyl, hydroxy, —$CO_2H$, an ester, an amide, $(C_1-C_6)$alkoxy, $(C_1-C_6)$thioalkyl and $(C_1-C_6)$perfluoroalkoxy. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

By the term "latent organo-transition metal catalyst" is meant organo-transition metal compounds that show little or no catalytic activity at a particular (usually ambient atmospheric conditions) temperature and initiate such activity either upon heat or light or both. Generally, the catalytic activity of the catalyst can be kept latent for a prolonged periods of time, which can range from five days or longer especially when it is stored at room temperature or lower in a dark atmosphere. Higher temperatures and/or light may accelerate the catalytic activity.

By the term "actinic radiation" or "photolytic conditions" is meant subjecting the compositions of this invention to suitable "electromagnetic radiation," which can be emitted from a laser, a digital processing (DLP) projector, a lamp, a light emitting diode (LED), a mercury arc lamp, a fiber optic, or liquid crystal display (LCD) and the like.

It will be understood that the terms "dielectric" and "insulating" are used interchangeably herein. Thus, reference to an insulating material or layer is inclusive of a dielectric material or layer and vice versa. Further, as used herein, the term "organic electronic device" will be understood to be inclusive of the term "organic semiconductor device" and the several specific implementations of such devices used, for example, in electronic, automotive or other industries.

As used herein, the dielectric constant (Dk) of a material is the ratio of the charge stored in an insulating material placed between two metallic plates to the charge that can be stored when the insulating material is replaced by vacuum or air. It is also called as electric permittivity or simply permittivity. And, at times referred as relative permittivity, because it is measured relatively from the permittivity of free space.

As used herein, "low-loss" is the dissipation factor (Df), which is a measure of loss-rate of energy of a mode of oscillation (mechanical, electrical, or electromechanical) in a dissipative system. It is the reciprocal of quality factor, which represents the "quality" or durability of oscillation.

By the term "derived" is meant that the polymeric repeating units are polymerized (formed) from, for example, polycyclic norbornene-type monomers in accordance with formulae (I) or (III) or (IV) wherein the resulting polymers are ring opened metathesis polymerized (ROMP), for example, the 2,3 double bond of norbornene-type monomers are ring opened and polymerized as shown below:

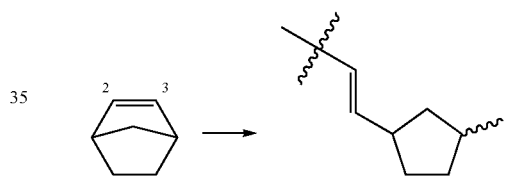

Accordingly, in accordance with the practice of this invention there is provided a single component composition encompassing a) one or more monomers of formula (I):

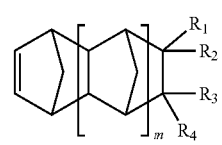

(I)

wherein:

m is an integer 0, 1 or 2;

$R_1$, $R_2$, $R_3$ and $R_4$ are the same or different and each independently selected from the group consisting of hydrogen, halogen, methyl, ethyl, linear or branched $(C_3-C_{16})$alkyl, perfluoro$(C_1-C_{12})$alkyl, hydroxy$(C_1-C_{16})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_6)$alkyl, tri$(C_1-C_6)$alkoxysilyl and a group of formula (A):

—Z-Aryl (A)

wherein:

Z is a bond or a group selected from the group consisting of:

$(CR_5R_6)_a$, $O(CR_5R_6)_a$, $(CR_5R_6)_aO$, $(CR_5R_6)_a$—O—$(CR_5R_6)_b$, $(CR_5R_6)_a$—O—$(SiR_5R_6)_b$, $(CR_5R_6)_a$—(CO)O—$(CR_5R_6)_b$, $(CR_5R_6)_a$—O(CO)—$(CR_5R_6)_b$, $(CR_5R_6)_a$—(CO)—$(CR_5R_6)_b$, where a and b are integers which may be the same or different and each independently is 1 to 12;

$R_5$ and $R_6$ are the same or different and each independently selected from the group consisting of hydrogen, methyl, ethyl, linear or branched $(C_3-C_6)$alkyl, hydroxy, methoxy, ethoxy, linear or branched $(C_3-C_6)$alkyloxy, acetoxy, $(C_2-C_6)$acyl, hydroxymethyl, hydroxyethyl, linear or branched hydroxy$(C_3-C_6)$alkyl, phenyl and phenoxy;

Aryl is phenyl or phenyl substituted with one or more of groups selected from the group consisting of methyl, ethyl, linear or branched $(C_3-C_6)$alkyl, hydroxy, methoxy, ethoxy, linear or branched $(C_3-C_6)$alkyloxy, acetoxy, $(C_2-C_6)$acyl, hydroxymethyl, hydroxyethyl, linear or branched hydroxy$(C_3-C_6)$alkyl, phenyl and phenoxy;

b) an organo-ruthenium compound of the formula (II):

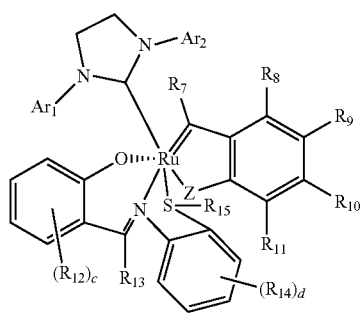

(II)

wherein c and d are integers from 0 to 5;

Z is oxygen or sulfur;

$R_7$ is selected from the group consisting of hydrogen, $(C_1-C_{20})$alkyl, $(C_2-C_{20})$alkenyl, $(C_2-C_{20})$alkynyl and $(C_6-C_{10})$aryl; and $R_8$, $R_9$, $R_{10}$ and $R_{11}$ are the same or different and each independently selected from the group consisting of hydrogen, halogen, $(C_1-C_{16})$alkyl, $(C_1-C_{16})$alkoxy, $(C_1-C_{16})$perfluoroalkyl, $(C_3-C_7)$cycloalkyl, $(C_2-C_{16})$alkenyl, $(C_6-C_{14})$aryl, $(C_6-C_{14})$perfluoroaryl, $(C_3-C_{12})$heterocyclyl, —$OR_{16}$, —$NO_2$, —COOH, —$COOR_{16}$, —$CONR_{16}R_{17}$, —$SO_2NR_{16}R_{17}$, —$SO_2R_{16}$, —CHO, —$COR_{16}$, wherein $R_{16}$ and $R_{17}$ are the same or different and each independently selected from the group consisting of $(C_1-C_6)$alkyl, $(C_1-C_6)$perfluoroalkyl, $(C_6-C_{14})$aryl, $(C_6-C_{14})$perfluoroaryl; or wherein two or more of $R_8$, $R_9$, $R_{10}$ and $R_{11}$ taken together with the carbon atoms to which they are attached to form a substituted or unsubstituted, fused $(C_4-C_8)$carbocyclic ring, or a substituted or unsubstituted, fused aromatic ring;

each $R_{12}$, $R_{13}$ and $R_{14}$ may be the same or different and independently of the other selected from the group consisting of hydrogen, halogen, $(C_1-C_{16})$alkyl, $(C_1-C_{16})$alkoxy, $(C_1-C_{16})$perfluoroalkyl, $(C_3-C_7)$cycloalkyl, $(C_2-C_{16})$alkenyl, $(C_6-C_{14})$aryl, $(C_6-C_{14})$perfluoroaryl, $(C_3-C_{12})$heterocyclyl, —$OR_{16}$, —$NO_2$, —COOH, —$COOR_{16}$, —$CONR_{16}R_{17}$, —$SO_2NR_{16}R_{17}$, —$SO_2R_{16}$, —CHO, —$COR_{16}$, wherein $R_{16}$ and $R_{17}$ are the same or different and each independently selected from the group consisting of $(C_1-C_6)$alkyl, $(C_1-C_6)$perfluoroalkyl, $(C_6-C_{14})$aryl, $(C_6-C_{14})$perfluoroaryl;

$R_{15}$ is selected from the group consisting of $(C_1-C_{16})$alkyl, $(C_1-C_{16})$perfluoroalkyl, $(C_3-C_{16})$cycloalkyl, $(C_6-C_{14})$aryl, $(C_6-C_{14})$perfluoroaryl and $(C_3-C_{12})$heterocyclyl;

$Ar_1$ and $Ar_2$ are the same or different and each independently selected from the group consisting of substituted or unsubstituted phenyl, substituted or unsubstituted biphenyl and substituted or unsubstituted naphthyl, wherein each of said substituents are independently selected from the group consisting of methyl, ethyl and linear or branched $(C_3-C_6)$alkyl; and c) a photoactive compound.

Surprisingly, it has now been found that incorporation of certain additives in the compositions of this invention provide additional stability to the composition depending upon the intended use or application. Specifically, it has now been found that incorporation of certain ultraviolet (UV) light blockers imparts surprisingly further stability to the composition of this invention especially when used in the surroundings of UV exposure, such as for example, in a vat of the 3D printer or in the encapsulation of an OLED device. Even more importantly, it has now been found that incorporation of two or more such UV blocking compounds further provides synergistic effect in that the compositions of this invention can be cured at similar or faster speeds when compared with compositions not employing such two or more UV blocking compounds. It is surprising to note that the incorporation of these two or more UV blockers do not decrease the mass polymerization activity of the compositions of this invention when exposed to suitable actinic radiation, thus providing a synergistic and beneficial effect.

Accordingly, the composition of this invention contains at least one compound of formula (V):

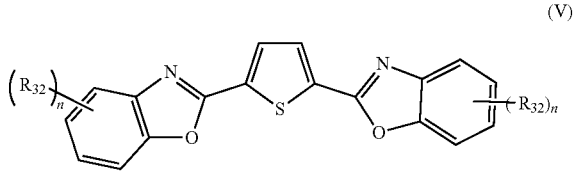

(V)

wherein n is an integer from 0 to 4;

each $R_{32}$ is independently selected from the group consisting of hydrogen, methyl, ethyl, linear or branched $(C_3-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl $(C_1-C_3)$alkyl, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl and $(C_6-C_{10})$aryloxy.

In addition, the composition of this invention contains at least one compound of formula (VI):

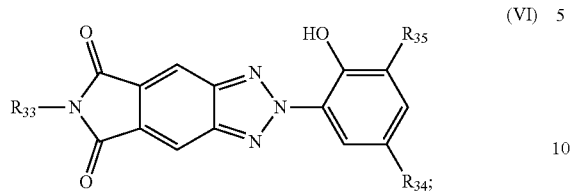

wherein

R$_{33}$ is selected from the group consisting of methyl, ethyl, linear or branched (C$_3$-C$_{12}$)alkyl and (C$_3$-C$_{12}$)cycloalkyl.

Each of R$_{34}$ and R$_{35}$ may be the same or different and independently selected from the group consisting of (C$_1$-C$_{10}$)alkyl, (C$_6$-C$_{18}$)aryl, (C$_6$-C$_{12}$)aryl(C$_1$-C$_5$)alkyl, and (C$_1$-C$_5$)alkyl(C$_6$-C$_{12}$)aryl. In some embodiments, R$_{34}$ and R$_{35}$ is independently selected from the group consisting of (C$_4$-C$_8$)alkyl, phenyl, and phenyl(C$_1$-C$_3$)alkyl. In some other embodiments, R$_{34}$ and R$_{35}$ is independently selected from the group consisting of (C$_5$-C$_8$)alkyl, and phenyl(C$_1$-C$_3$)alkyl.

Alkyl portion of R$_{34}$ and R$_{35}$ can be linear or branched. Again, in each occurrence independently selected in whole or part of such alkyl portion being branched. Optionally one or more of methylene of alkyl portion of R$_{34}$ and R$_{35}$ can be replaced with —CO—, —O—, or —COO—. That is, —CH$_2$— portion of alkyl is replaced with one of —CO—, —O—, or —COO—. In some embodiments one or more of hydrogens on methylene portion of R$_{34}$ and/or R$_{35}$ is replaced with —COO—.

By inclusion of a compound of formula (V) and a compound of formula (VI), surprisingly, it is now possible to not only improve the stability of the composition but also improve the optical performance of the articles made therefrom either in fabricating an OLED device or in the fabrication of an 3D article. It is believed that the compounds of formulae (V) or (VI) function as UV blockers, among other functions, thereby imparting greater stability to the composition while in peripheral contact with any UV light during the UV exposure of the composition, for example when the composition is drawn out of the vat for forming the intended 3D objects. Therefore, any of the compounds which may function similarly to that of compounds of formulae (V) or (VI) can also be employed in the composition of this invention, such as for example, any of the other known UV blockers. Any of the amounts of a compound of formulae (V) or (VI) that would bring about the desired benefit can be employed in the composition of this invention. Generally, such amounts may vary from about 1:200 molar parts of a compound of formulae (V) or (VI):a compound of formula (II). In some other embodiments such amounts are from about 1:100 molar parts of a compound of formulae (V) or (VI):a compound of formula (II); or 1:50 molar parts of a compound of formulae (V) or (VI):a compound of formula (II), and so on. It should be noted however that it is not necessary to employ same amounts of compounds of formulae (V) and (VI), but varied amounts of compounds of formula (V) in combination with suitable amount of compound of formula (VI) can be employed, generally in the amounts as described hereinabove.

Representative examples of the compounds of formula (V), without any limitation, may be listed as follows:

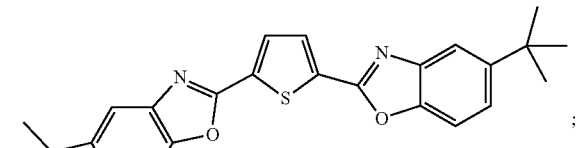

2,5-bis(5-(tert-butyl)benzo[d]oxazol-2-yl)thiophene (BTBBT), available commercially as Benetex OB Plus from Mayzo

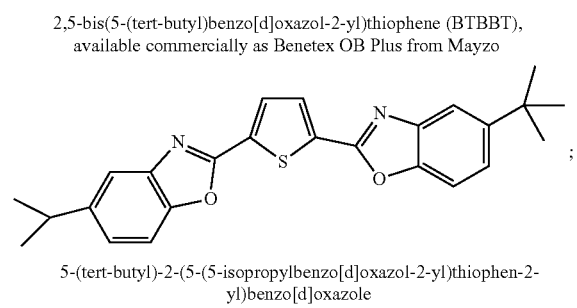

5-(tert-butyl)-2-(5-(5-isopropylbenzo[d]oxazol-2-yl)thiophen-2-yl)benzo[d]oxazole

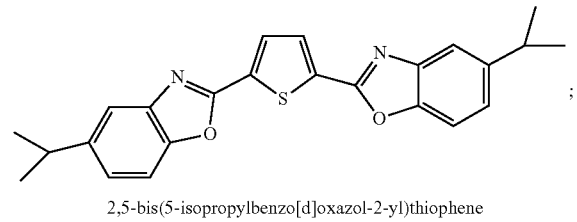

2,5-bis(5-isopropylbenzo[d]oxazol-2-yl)thiophene

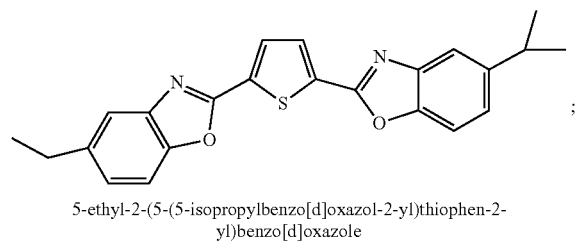

5-ethyl-2-(5-(5-isopropylbenzo[d]oxazol-2-yl)thiophen-2-yl)benzo[d]oxazole

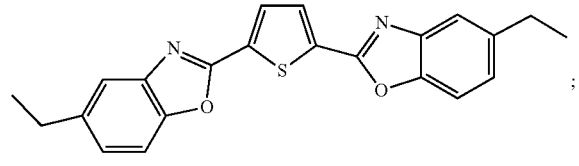

2,5-bis(5-ethylbenzo[d]oxazol-2-yl)thiophene

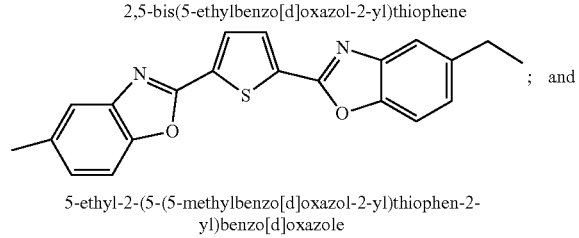

; and 5-ethyl-2-(5-(5-methylbenzo[d]oxazol-2-yl)thiophen-2-yl)benzo[d]oxazole

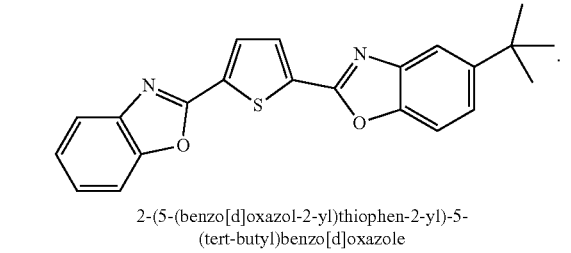

2-(5-(benzo[d]oxazol-2-yl)thiophen-2-yl)-5-(tert-butyl)benzo[d]oxazole

Representative examples of the compounds of formula (VI), without any limitation, may be listed as follows:

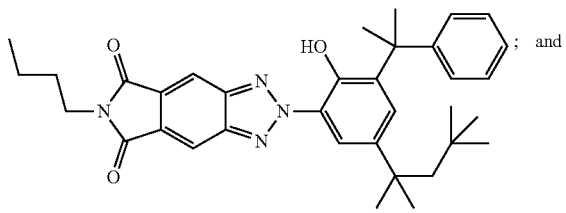

6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione

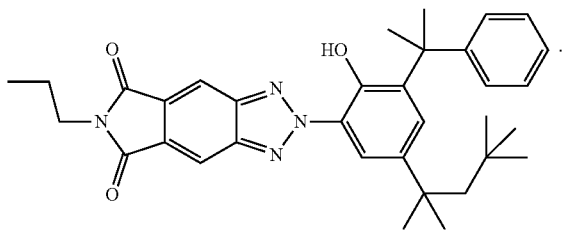

2-(2-hydroxy-3-(2-phenylpropan-2-yl)-5-(2,4,4-trimethylpentan-2-yl)phenyl)-6-propyl-[1,2,3]triazolo[4,5-f]isoindole-5,7(2H,6H)-dione Various other UV light blocking compounds and/or UV light absorbers that can be used in the composition of this invention include the following:

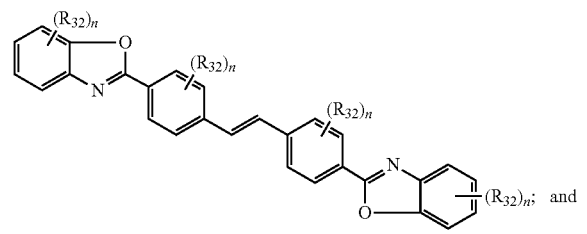

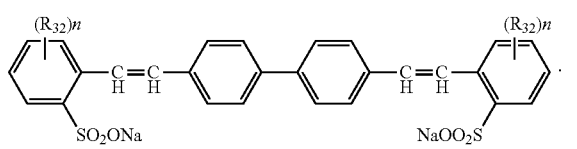

Wherein n and $R_{32}$ are as defined herein.

Representative compounds within the scope of compounds of formulae (Va) and (Vb) may be represented as follows:

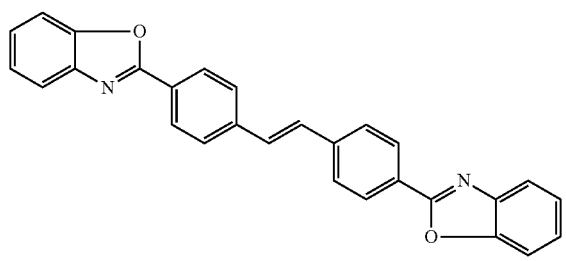 [SMILES: C(=C\c1ccc(-c2nc3ccccc3o2)cc1)/c1ccc(-c2nc3ccccc3o2)cc1]

1,2-bis(4-(benzo[d]oxazol-2-yl)phenyl)ethene, available commercially as Benetex OB-1 from Mayzo; and

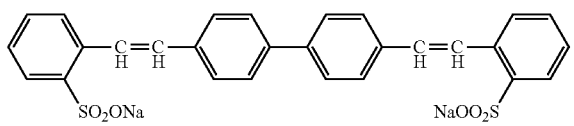

sodium 2,2'-([1,1'-biphenyl]-4,4'-diylbis(ethene-2,1-diyl)) dibenzenesulfonate, available commercially as Benetex OB-M1 from Mayzo.

As noted, the composition of this invention is in a clear liquid form at room temperature and remains clear solution at temperatures from about 25° C. to a temperature of about 80° C. for a period of from about three to six months. In general, it has been now observed that the viscosity of the composition also remains essentially constant over a period of three months to six months. In some embodiments the change in viscosity after storing for a period of about three to six months is about ten to twenty percent increase. The stability of the composition is also increased by storing under inert dark atmosphere as further discussed in detail below.

As used herein the Aryl may further include the following:

substituted or unsubstituted biphenyl of formula:

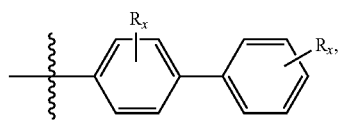

substituted or unsubstituted naphthyl of formula:

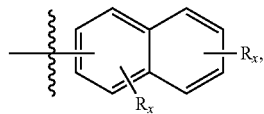

substituted or unsubstituted terphenyl of formula:

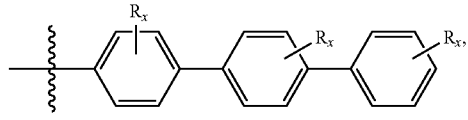

substituted or unsubstituted anthracenyl of formula:

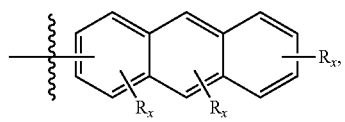

substituted or unsubstituted fluorenyl of formula:

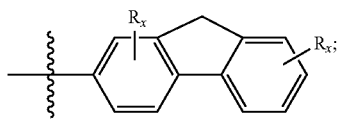

where $R_x$ in each occurrence is independently selected from methyl, ethyl, linear or branched ($C_3$-$C_{12}$)alkyl or ($C_6$-$C_{10}$)aryl.

As noted, the monomer of formula (I) is having a refractive index of at least 1.5. The composition is in a clear liquid form at room temperature. Surprisingly, as noted above, the compositions of this invention are stable at temperatures ranging from room temperature to 80° C., thus offering excellent shelf life stability. As used herein, "stable" means the composition of this invention remains clear without increase of any viscosity when kept at temperatures ranging from room temperature to 80° C., especially when kept in a dark atmosphere, such as for example, in amber or brown colored containers in the absence of any light. Accordingly, in some embodiments, the composition of this invention exhibits no viscosity change when stored at temperatures below 80° C. for a period of more than thirty (30) days. Accordingly, in some embodiments, the composition of this invention exhibits less than five (5) percent viscosity increase when stored at temperatures below 80° C. for a period of more than forty (40) days. In some other embodiments, the composition of this invention exhibits less than ten (10) percent viscosity change when stored at temperatures below 80° C. for a period of sixty (60) days to ninety (90) days. In some other embodiments, the composition of this invention exhibits less than twenty (20) percent viscosity change when stored at temperatures below 80° C. for a period of one-hundred twenty (120) days to one-hundred eighty (180) days. In some other embodiments, the composition of this invention exhibits less than two (2) percent viscosity change when stored at ambient temperatures, for example from about 20° C. to 25° C. for an extended period of time, which may range from about one-hundred twenty (120) days to three-hundred (300) days or longer. That is, the viscosity of the composition remains essentially unchanged when stored at ambient temperature conditions, yet the composition undergoes mass polymerization as soon as it is exposed to suitable actinic radiation as evidenced by UV-DSC measurements which indicated that the heat of polymerization remained unchanged even after a composition is stored for an extended period of time as disclose hereinabove.

The monomers employed in the composition of this invention are themselves known in the literature or can be prepared by any of the known methods in the art to make such or similar types of monomers.

In addition, the monomers as described herein readily undergo mass polymerization, i.e., in their neat form without use of any solvents when polymerized under mass ring open metathesis polymerization (ROMP) conditions using certain transition metal catalysts, such as for example, organo-ruthenium and organo-osmium compounds. See for example, R. H. Grubbs et al., *Handbook of Metathesis*, Ed.: Wiley-VCH, Weinheim, Germany, 2003, R. H. Grubbs et al., *Acc. Chem. Res.* 2001, 34, 18-29, R. H. Grubbs et al., *Angew. Chem. Int. Ed.,* 2006, 45, 3760-3765. Also, see U.S. Pat. No. 6,838,489, pertinent portions of which are incorporated herein by reference. The term "mass polymerization" as used herein shall have the generally accepted meaning in the art. That is, a polymerization reaction that is generally carried out substantially in the absence of a solvent. In some cases, however, a small proportion of solvent is present in the reaction medium. For example, such small amounts of solvent may be used to dissolve the latent catalyst and/or the activator or convey the same to the reaction medium. Also, some solvent may be used to reduce the viscosity of the monomer. The amount of solvent that can be used in the reaction medium may be in the range of 0 to 5 weight percent based on the total weight of the monomers employed. Any of the suitable solvents that dissolves the catalyst, activator and/or monomers can be employed in this invention. Examples of such solvents include alkanes, cycloalkane, toluene, THF, dichloromethane, dichloroethane, and the like.

Advantageously, it has now been found that one or more of the monomers themselves can be used to dissolve the latent catalyst as well as the activator and thus avoiding the need for the use of solvents. In addition, one monomer can itself serve as a solvent for the other monomer and thus eliminating the need for an additional solvent. For example, if first monomer of formula (I) is a solid at room temperature, then the second monomer of formula (I), which is liquid at room temperature can be used as a solvent for the first monomer of formula (I) which is a solid or vice versa. Therefore, in such situations more than one monomer can be employed in the composition of this invention.

Accordingly, it has now been surprisingly found that monomers of formula (I) serve as high refractive index materials imparting high refractive index to the resulting polymeric film upon mass polymerization at a temperature and/or condition different from the application of the composition onto a desirable substrate. In general, the monomers of formula (I) which are suitable in this invention feature a refractive index of at least 1.5. In some embodiments the refractive index of the monomers of formula (I) is higher than 1.5. In some other embodiments the refractive index of the monomers of formula (I) is in the range from about 1.5 to 1.6. In yet some other embodiments the refractive index of the monomers of formula (I) is higher than 1.55, higher than 1.6 or higher than 1.65. In some other embodiments it may even be higher than 1.7.

In general, the composition of this invention exhibits low viscosity at room temperature, which can be below 100 centipoise or lower. In some embodiments, the viscosity at room temperature of the composition of this invention is less than 80 centipoise. In some other embodiments the viscosity at room temperature of the composition of this invention is in the range from about 10 to 100 centipoise. In yet some other embodiments the viscosity at room temperature of the composition of this invention is lower than 70 cP, lower than 60 cP, lower than 40 cP, lower than 20 cP at room temperature. In some other embodiments it may even be lower than 10 cP and may vary from as low as 4 cP to 9 cP at room temperature.

When the composition of this invention contains two or more monomers, for example, they can be present in any desirable amounts that would bring about intended benefit, including either refractive index modification or viscosity modification or both. Accordingly, the molar ratio of first monomer of formula (I) to second monomer of formula (II) can be from 1:99 to 99:1. In some embodiments, the molar ratio of first monomer of formula (I):second monomer of formula (I) is in the range from 5:95 to 95:5; in some other embodiments it is from 10:90 to 90:10; it is from 20:80 to 80:20; it is from 30:70 to 70:30; it is from 60:40 to 40:60;

and it is 50:50, and so on. Similarly, when more than two different monomers of formula (I) are employed, any ratios of such monomers can be used that would bring about the intended result.

In general, the compositions in accordance with the present invention encompass the above described one or more of the monomer of formula (I) and if needed additional monomers of formula (I) distinct from each other, as it will be seen below, various composition embodiments are selected to provide properties to such embodiments that are appropriate and desirable for the use for which such embodiments are directed, thus such embodiments are tailorable to a variety of specific applications.

For example, as already discussed above, proper combination of distinctive monomers of formula (I) makes it possible to tailor a composition having the desirable refractive index, viscosity and optical transmission properties. In addition, as described further herein it may be desirable to include other polymeric or monomeric materials, such as for example inorganic nanoparticles which are compatible to provide desirable optical properties depending upon the end use application. Accordingly, the compositions of this invention can also include other high refractive polymeric materials and/or nanoparticles which will bring about such intended benefit. Examples of such polymers include without any limitation, poly(α-methylstyrene), poly(vinyl-toluene), copolymers of α-methylstyrene and vinyl-toluene, and the like. Examples of such nanoparticles include without any limitation, organic or inorganic nanoparticles in a size range of 1-100 nm including materials like crosslinked poly(styrene), crosslinked poly(methacrylates), metal oxides (e.g., zinc oxide, magnesium oxide, titanium oxide), silicon, silicon oxide, silicon nitride, and luminescent materials (e.g., III-V semiconductor nanoparticles like indium phosphide).

Advantageously, it has further been found that the compositions of this invention can also contain additional monomers. In some embodiments, the composition according to this invention may further contain one or more monomers selected from monomer of formula (III).

The monomer of formula (III) is:

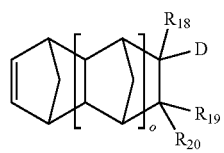

(III)

wherein:

o is an integer from 0 to 2, inclusive;

D is $SiR_{21}R_{22}R_{23}$ or a group selected from:

—$(CH_2)_c$—O—$SiR_{21}R_{22}R_{23}$ (E);

—$(CH_2)_c$—$SiR_{21}R_{22}R_{23}$ (F); and

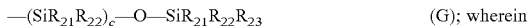

—$(SiR_{21}R_{22})_c$—O—$SiR_{21}R_{22}R_{23}$ (G); wherein c is an integer from 1 to 10, inclusive, and where one or more of $CH_2$ is optionally substituted with $(C_1-C_{10})$alkyl, $(C_1-C_{10})$perfluoroalkyl or $(C_6-C_{14})$aryl;

$R_{18}$, $R_{19}$ and $R_{20}$ are the same or different and independently of each other selected from hydrogen, halogen and hydrocarbyl, where hydrocarbyl is selected from methyl, ethyl, linear or branched $(C_3-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl or $(C_6-C_{10})$aryloxy; and $R_{21}$, $R_{22}$ and $R_{23}$ are each independently of one another methyl, ethyl, linear or branched $(C_3-C_9)$alkyl, substituted or unsubstituted $(C_6-C_{14})$aryl, methoxy, ethoxy, linear or branched $(C_3-C_9)$alkoxy or substituted or unsubstituted $(C_6-C_{14})$aryloxy.

In this aspect of the invention, it has now been found that monomers of formula (III) provides further advantages. Namely, the monomers of formula (III) depending upon the nature of the monomer may impart high or low refractive index to the composition, low or high dielectric constant, thus it can be tailored to meet the need. In addition, the monomers of formula (III) generally improve the adhesion properties and thus can be used as "adhesion modifiers." Finally, the monomers of formula (III) may exhibit low viscosity and good solubility for the latent catalyst and/or activator, among various other advantages.

In some embodiments, the composition of this invention contains first and second monomer of formula (I) distinct from each other and one of said first and second monomers having a refractive index of at least 1.5 and viscosity below 100 centipoise, and wherein said first monomer is completely miscible with said second monomer to form a clear solution. However, as noted, any one or more of monomers of formula (III) can also be used in this embodiment of the invention.

In some embodiments the composition of this invention may also contain one or more monomers of formula (IV):

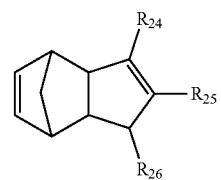

(IV)

wherein $R_{24}$ and $R_{25}$ are the same or different and each independently selected from the group consisting of hydrogen, methyl, ethyl, linear or branched $(C_3-C_6)$alkyl, methoxy, ethoxy, linear or branched $(C_3-C_6)$alkyloxy, acetoxy, $(C_2-C_6)$acyl, phenyl and phenoxy; or $R_{24}$ taken together with $R_{25}$ and the carbon atoms to which they are attached to form a $(C_5-C_7)$carbocyclic ring optionally containing one or more double bonds;

$R_{26}$ is hydrogen, halogen, methyl, ethyl, linear or branched $(C_3-C_{16})$alkyl, $(C_6-C_{10})$aryl, $(C_6-C_{10})$aryl$(C_1-C_6)$alkyl, hydroxy, methoxy, ethoxy, linear or branched $(C_3-C_{16})$alkoxy, $(C_6-C_{10})$aryloxy, $(C_6-C_{10})$aryl$(C_1-C_6)$alkoxy, —$O(CO)R_{27}$ and —$O(CO)OR_{27}$, where $R_{27}$ is methyl, ethyl, linear or branched $(C_3-C_{16})$alkyl, $(C_6-C_{10})$aryl and $(C_6-C_{10})$aryl$(C_1-C_6)$alkyl.

Accordingly, any of the monomers within the scope of monomer of formula (I) can be employed in the composition of the invention. Representative examples of monomer of formula (I) include the following without any limitations:

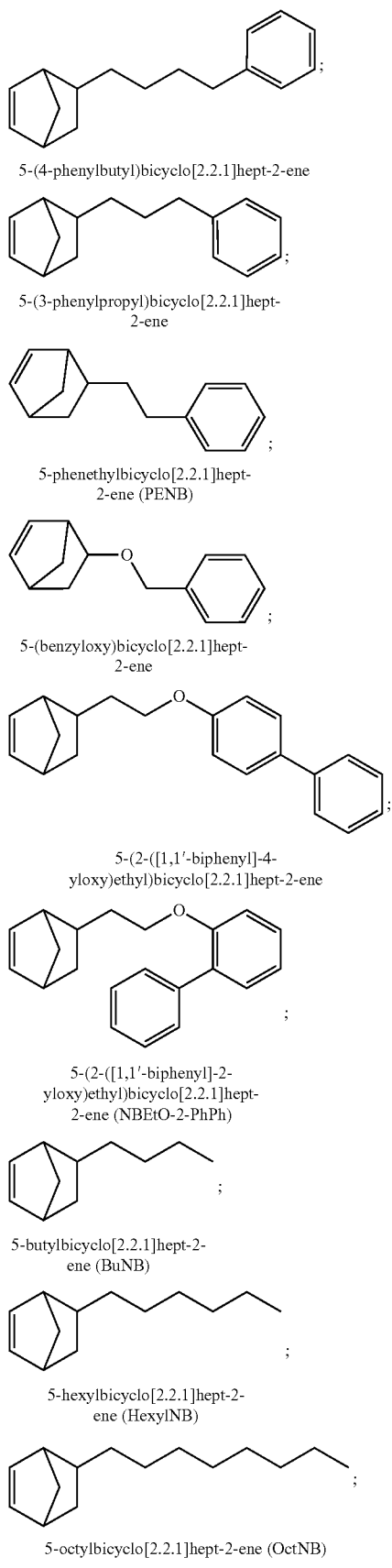
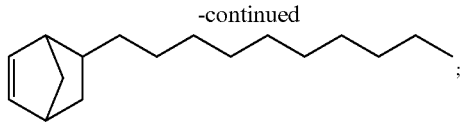

5-decylbicyclo[2.2.1]hept-2-ene (DecNB)

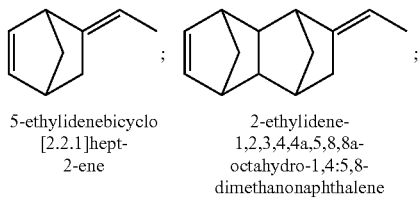

5-ethylidenebicyclo
[2.2.1]hept-
2-ene 2-ethylidene-
1,2,3,4,4a,5,8,8a-
octahydro-1,4:5,8-
dimethanonaphthalene

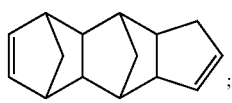

3a,4,4a,5,8,8a,9,9a-
octahydro-1H-4,9:5,8-
dimethanocyclopenta[b]
naphtahalene (one of
trimers of cyclopentadiene,
TCPD1, also known as
CPD3)

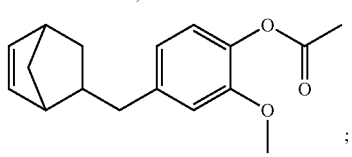

5-norbornenylmethyleugenyl
acetace (EuAcNB)

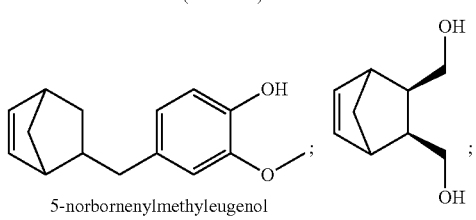

5-norbornenylmethyleugenol
(EuOHNB)    NB(MeOH)$_2$

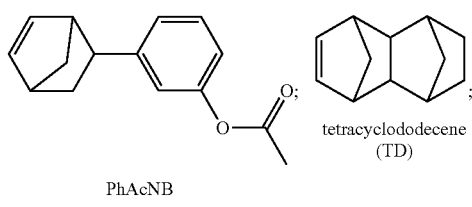

PhAcNB    tetracyclododecene (TD)

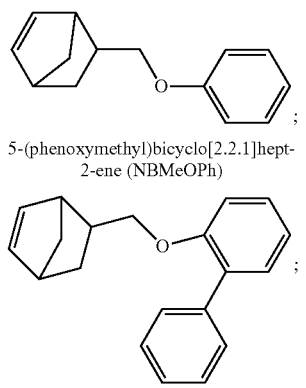

5-(phenoxymethyl)bicyclo[2.2.1]hept-
2-ene (NBMeOPh)

5-(([1,1'-biphenyl]-2-
yloxy)methyl)bicyclo[2.2.1]hept-
2-ene (NBMeOPhPh)

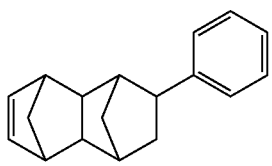

2-phenyl-tetracyclododecene
(PhTD)

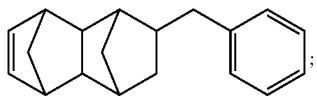

2-benzyl-1,2,3,4,4a,5,8,8a-octahydro-
1,4:5,8-dimethanonaphthalene

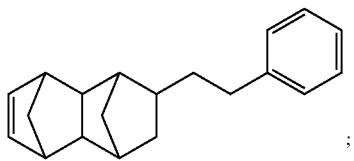

2-phenethyl-1,2,3,4,4a,5,8,8a-octahydro-
1,4:5,8-dimethanonaphthalene (PETD)

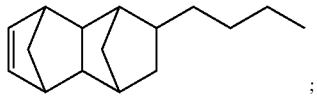

2-butyl-1,2,3,4,4a,5,8,8a-octahydro-
1,4:5,8-
dimethanonaphthalene (ButylTD)

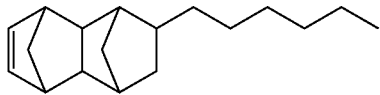

2-hexyl-1,2,3,4,4a,5,8,8a-octahydro-1,4:5,8-
dimethanonaphthalene (HexylTD)

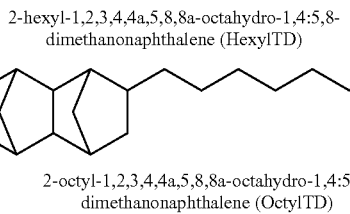

2-octyl-1,2,3,4,4a,5,8,8a-octahydro-1,4:5,8-
dimethanonaphthalene (OctylTD)

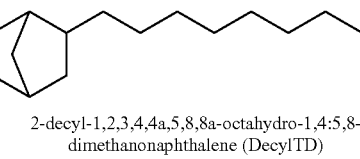

2-decyl-1,2,3,4,4a,5,8,8a-octahydro-1,4:5,8-
dimethanonaphthalene (DecylTD)

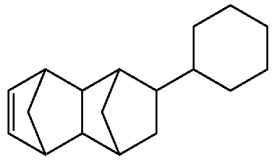

2-cyclohexyl-tetracyclododecene
(CyclohexylTD)

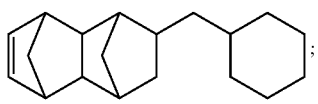

2-cyclohexylmethyl-
1,2,3,4,4a,5,8,8a-octahydro-1,4:5,8-
dimethanonaphthalene

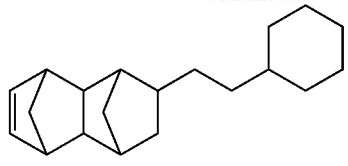

2-cyclohexylethyl-
1,2,3,4,4a,5,8,8a-octahydro-
1,4:5,8-dimethanonaphthalene

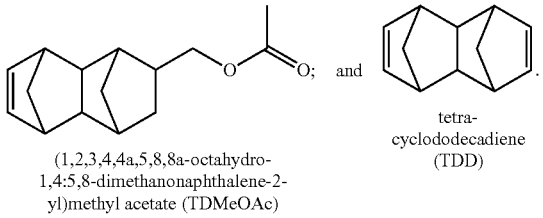 and 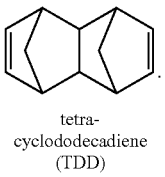

(1,2,3,4,4a,5,8,8a-octahydro-
1,4:5,8-dimethanonaphthalene-2-
yl)methyl acetate (TDMeOAc)

tetra-
cyclododecadiene
(TDD)

Similarly, any of the monomers within the scope of monomer of formula (III) can be employed in the composition of this invention. Representative examples of monomer of formula (III) include the following without any limitations:

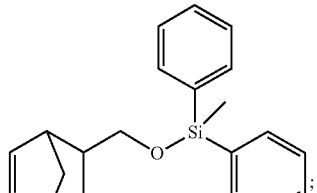

(bicyclo[2.2.1]hept-5-en-2-
ylmethoxy)(methyl)diphenylsilane
(NBCH2OSiMePh2)

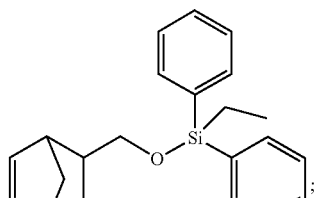

(bicyclo[2.2.1]hept-5-en-2-
ylmethoxy)(ethyl)diphenylsilane

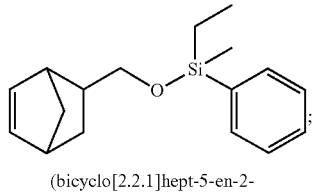

(bicyclo[2.2.1]hept-5-en-2-
ylmethoxy)(ethyl)(methyl)
(phenyl)silane

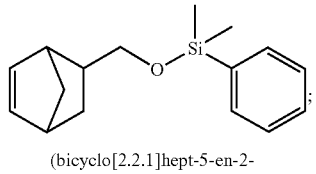

(bicyclo[2.2.1]hept-5-en-2-
ylmethoxy)dimethyl(phenyl)silane

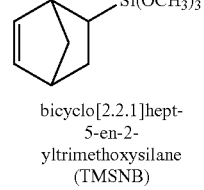

bicyclo[2.2.1]hept-
5-en-2-
yltrimethoxysilane
(TMSNB)

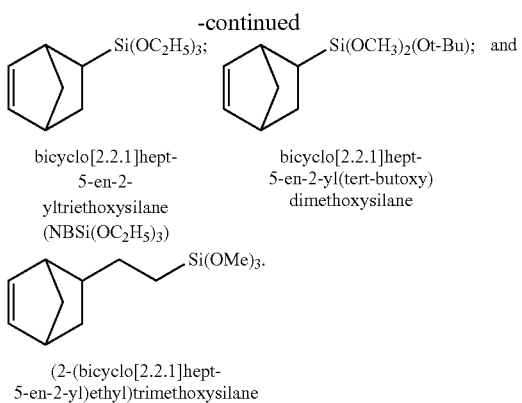

bicyclo[2.2.1]hept-5-en-2-yltriethoxysilane (NBSi(OC₂H₅)₃)

bicyclo[2.2.1]hept-5-en-2-yl(tert-butoxy)dimethoxysilane and (2-(bicyclo[2.2.1]hept-5-en-2-yl)ethyl)trimethoxysilane Representative examples of monomer of formula (IV) include the following without any limitations:

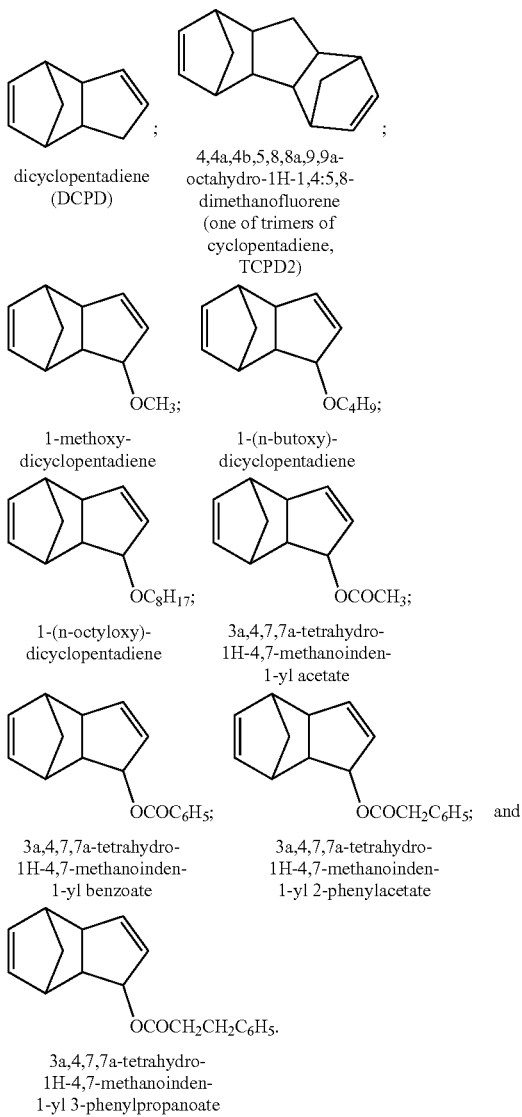

dicyclopentadiene (DCPD)

4,4a,4b,5,8,8a,9,9a-octahydro-1H-1,4:5,8-dimethanofluorene (one of trimers of cyclopentadiene, TCPD2)

1-methoxy-dicyclopentadiene 1-(n-butoxy)-dicyclopentadiene 1-(n-octyloxy)-dicyclopentadiene 3a,4,7,7a-tetrahydro-1H-4,7-methanoinden-1-yl acetate 3a,4,7,7a-tetrahydro-1H-4,7-methanoinden-1-yl benzoate 3a,4,7,7a-tetrahydro-1H-4,7-methanoinden-1-yl 2-phenylacetate and 3a,4,7,7a-tetrahydro-1H-4,7-methanoinden-1-yl 3-phenylpropanoate As noted, the composition of this invention contains at least one of organo-ruthenium compound of formulae (II) that would bring about the mass polymerization as described herein under ROMP conditions when the composition is subjected to suitable actinic radiation. Generally, such an organo-ruthenium compound of formulae (II) is "latent" and become active only under certain conditions. Again, as used herein the term "latent" means that the organo-ruthenium catalyst used in the composition of this invention remains inactive for a prolonged period of time when the composition of this invention is stored at ambient conditions to temperatures up to 80° C. Accordingly, in some embodiments the organo-ruthenium catalysts remain latent for a period of more than thirty (30) days when stored at temperatures below 80° C. In some other embodiments, the organo-ruthenium catalyst remains latent for a period of forty (40) days to ninety (90) days when stored at temperatures below 50° C.

Generally, any of the latent organo-ruthenium compound of formulae (II) that would bring about ring open metathesis polymerization of the monomers of formulae (I) or (III) or (IV) can be employed in the composition of this invention. Interestingly, it has now been found that organo-ruthenium compounds of formula (II) are very stable at temperatures from about 25° C. (i.e., ambient conditions) up to a temperature of about 80° C. and can be stored as such or in the presence of one or more monomers of formulae (I) or (III) or (IV) for several days even including up to three to six months or even longer. That is, the organo-ruthenium compounds of formula (II) serve as latent catalysts that are stable at or near room temperature to elevated temperatures of up to 80° C. and yet can be readily activated by a variety of conditions, including without any limitation thermal, acid, light and chemical activation only when needed. The chemical activation may include use of thermal acid generator or photo acid generators.

Several of the latent catalysts that are known in the literature are not stable under the conditions specified herein and most of them do not exhibit the required shelf life stability as described herein. See for example, Grubbs, et al., Organometallics, 2011, 30 (24): 6713-6717; Sutar et al., Angew. Chem. Int. Ed. 2016, 55, 764-767; Leitgeh, et al., Monatsh Chem (2014) 145:1513-1517; van Hensbergen, et al., J. Mater. Chem. C. 2015, 3, 693-702; Grubbs, et al., J. Am. Chem. Soc., 2009, 131, 203802039; Zak, et al., Eur. J. Inorg. Chem., 2014, 1131-1136; Gawin, et al., ACS Catal. 2017, 7, 5443-5449. Further examples of such catalysts can also be found in U.S. Pat. No. 9,328,132, pertinent portions of which are incorporated herein by reference. Accordingly, the compositions encompassing the organo-ruthenium compounds of formula (II) provide hitherto unattainable advantages in various applications as described herein.

Accordingly, in some embodiments, the composition of this invention contains an organo-ruthenium compound of formulae (II), wherein:

Z is oxygen;

$R_7$ is hydrogen;

$R_8$, $R_9$, $R_{10}$ and $R_{11}$ are the same or different and each independently selected from the group consisting of hydrogen, methyl, ethyl and —$NO_2$;

$R_{12}$, $R_{13}$ and $R_{14}$ are the same or different and each independently selected from the group consisting of hydrogen, methyl, ethyl and —$NO_2$;

$R_{15}$ is selected from the group consisting of methyl, ethyl and cyclohexyl;

$Ar_1$ and $Ar_2$ are the same or different and each independently selected from the group consisting of phenyl, 2,6-dimethylphenyl, 2,6-diethylphenyl, 2,6-di(isopropyl)phenyl and 2,4,6-trimethylphenyl.

Accordingly, a few of the exemplary latent catalysts, which are within the scope of organo-ruthenium compounds of formula (II), without any limitation maybe selected from the group consisting of:

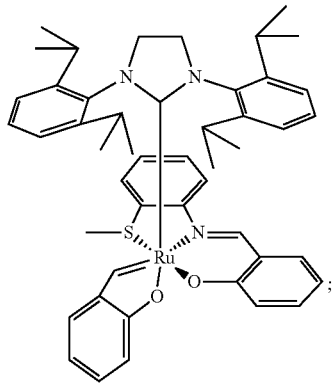

[1,3-bis(2,6-diisopropylphenyl)-2-imidazolidinylidene]{2-[(E)-({2-[methythio-κS]phenyl}imino-κN)methyl]phenoxido-κO}[2-(oxido-κO)benzylidene-κC]ruthenium(II)

(Ru-1)

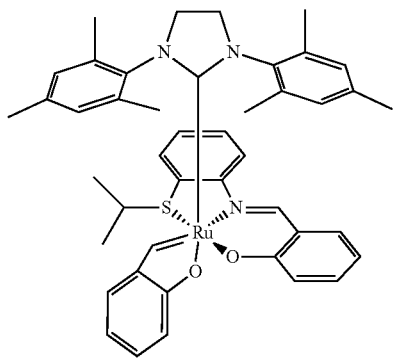

[1,3-bis(2,4,6-trimethylphenyl)-2-imidazolidinylidene]{2-[(E)-({2-[isopropythio-κS]phenyl}imino-κN)methyl]phenoxido-κO}[2-(oxido-κO)benzylidene-κC]ruthenium(II)

(Ru-2)

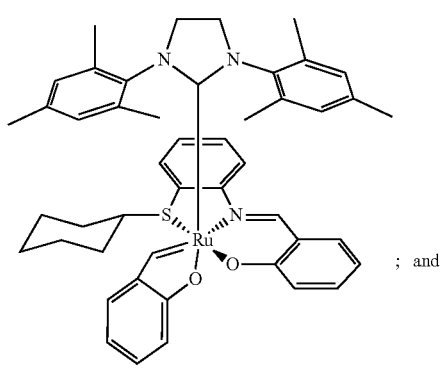

[1,3-Bis(2,4,6-trimethylphenyl)-2-imidazolidinylidene]{2-[(E)-({2-cyclohexylthio-κS]phenyl}imino-κN)methyl]phenoxido-κO}[2-(oxido-κO)benzylidene-κC]ruthenium(II)

(Ru-3)

; and

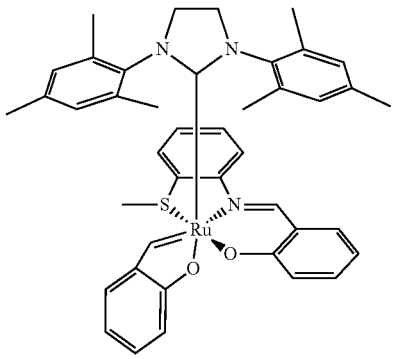

[1,3-bis(2,4,6-trimethylphenyl)-2-imidazolidinylidene]{2-[(E)-({2-methylthio-κS]phenyl}imino-κN)methyl]phenoxido-κO}[2-(oxido-κO)benzylidene-κC]ruthenium(II)

(Ru-4)

Interestingly, it has now been found that the organo-ruthenium compounds of formula (II) can be activated by certain of the known photoactive compounds when subjected to suitable photolytic conditions thereby facilitating mass polymerization of one or more monomers of the formulae (I) or (III) or (IV) contained in the composition of this invention under ROMP conditions as described herein. Accordingly, it has now been found that certain of the known photoactive compounds, such as for example, a class of substituted xanthone derivatives can be used for this purpose, which are as illustrated by structural formula (VII):

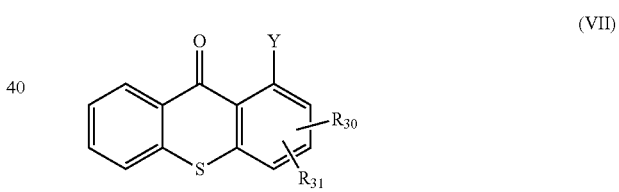

(VII)

wherein

Y is halogen; and $R_{30}$ and $R_{31}$ are the same or different and independently of each other selected from the group consisting of hydrogen, methyl, ethyl, linear or branched ($C_3$-$C_{12}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_3$)alkyl, ($C_1$-$C_{12}$)alkoxy, ($C_3$-$C_{12}$)cycloalkoxy, ($C_6$-$C_{12}$)bicycloalkoxy, ($C_7$-$C_{14}$)tricycloalkoxy, ($C_6$-$C_{10}$)aryloxy ($C_1$-$C_3$)alkyl and ($C_6$-$C_{10}$)aryloxy.

In some embodiments, the compound of formula (VII) is having the following:

Y is chlorine or bromine; and $R_{30}$ and $R_{31}$ are the same or different and independently of each other selected from the group consisting of hydrogen, methyl, ethyl, n-propyl, iso-propyl, phenyl, cyclohexyl, methoxy, ethoxy, n-propoxy and phenoxy.

Representative examples of the compounds of formula (VII), without any limitation, may be listed as follows:

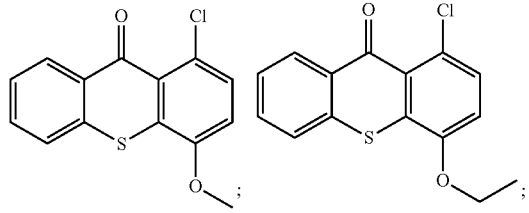

1-chloro-4-methoxy-9H-thioxanthen-9-one 1-chloro-4-ethoxy-9H-thioxanthen-9-one

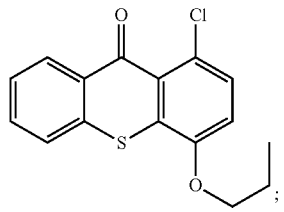

1-chloro-4-propoxy-9H-thioxanthen-9-one
(commerically sold under the name CPTX from Lambson)

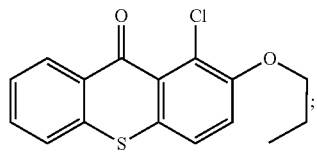

1-chloro-2-propoxy-9H-thioxanthen-9-one

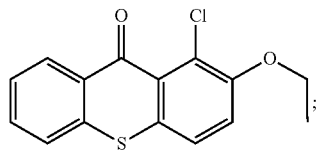

1-chloro-2-ethoxy-9H-thioxanthen-9-one

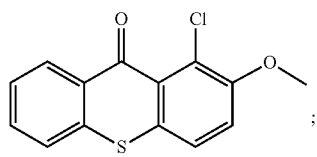

1-chloro-2-methoxy-9H-thioxanthen-9-one

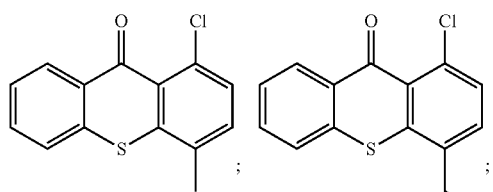

1-chloro-4-methyl-9H-thioxanthen-9-one 1-chloro-4-ethyl-9H-thioxanthen-9-one

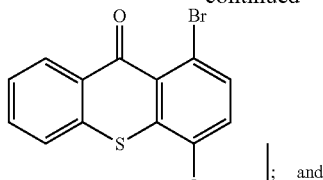

1-bromo-4-propoxy-9H-thioxanthen-9-one

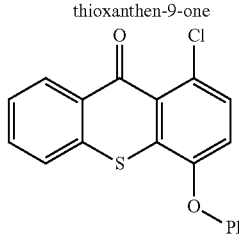

1-chloro-4-phenoxy-9H-thioxanthen-9-one

As noted, surprisingly, it has now been found that employing a suitable combination of a compound of formula (II) in combination with one or more of a compound of formula (VII) can trigger the mass polymerization of the monomers when the composition is subjected to a suitable actinic radiation, generally at wavelengths of from about 240 nm to 410 nm, the composition undergoes mass ring open-metathesis polymerization (ROMP) to form a transparent film or an object.

Any amount of organo-ruthenium compound of formulae (II) can be employed in the composition of this invention which will bring about the intended result. Generally, the combined molar ratios of monomers of formulae (I), (III) and (IV):compound of formulae (II) is in the range of 10,000:1 to 5,000:1 or lower. In some other embodiments such molar ratio of monomer:compound of formula (II) is 15,000:1, 20,000:1 or higher.

Any amount of a compound of formula (VII) can be employed in the composition of this invention which will bring about the intended result. Generally, the amount of compound of formula (VII) employed can range from 0.5 parts per hundred parts (phr) of monomer(s) employed to about 3 parts per hundred parts of monomer(s) employed or higher. In some other embodiments such amount of compound of formula (VII) is 1 phr per 100 phr of monomer(s), 1.5 phr per 100 phr of monomer(s), 2 phr per 100 phr of monomer(s), 2.5 phr per 100 phr of monomer(s). In some other embodiments the amount of compound of formula (VII) employed can be lower than 0.5 phr per 100 phr of monomer(s) or higher than 3 phr per 100 phr of monomer(s) depending upon the intended rate of cure of the composition of this invention.

In some embodiments the composition of this invention undergoes mass polymerization when exposed to suitable UV irradiation to form a substantially transparent film. The monomers undergo mass polymerization to form films which are substantially transparent to visible light. That is, most of the visible light is transmitted through the film. In some embodiments such film formed from the composition of this invention exhibits a transmission of equal to or higher than 90 percent of the visible light. In some other embodiments such film formed from the composition of this invention exhibits a transmission of equal to or higher than 95 percent of the visible light.

It should further be noted that the compositions of this invention undergo mass polymerization at a rate similar to those of the compositions containing neither one of the two UV blockers when exposed to suitable actinic radiation. Similarly, the composition of this invention exhibits similar rate of polymerization when compared with a composition containing only one of the UV blockers. Thus, there is no discernable decrease in activity of the rate of polymerization of the compositions of this invention when subjected to suitable actinic radiation. Furthermore, the films formed from the compositions of this invention exhibit substantially same percent transmission as shown in FIG. 1 and FIG. 2, where a composition of this invention is shown to exhibit better than 90% transmission at wavelengths from 370 nm to 800 nm. This aspect is further illustrated in working embodiments as described hereinbelow.

Accordingly, in some embodiments the compositions of this invention can be mass polymerized to form solid objects, such as transparent films, in less than five seconds after exposure to suitable actinic radiation. In some other embodiments the compositions of this invention can be mass polymerized to form solid objects, such as transparent films, in less than ten seconds after exposure to suitable actinic radiation. In yet some other embodiments the compositions of this invention can be mass polymerized to form solid objects, such as transparent films, in one to ten seconds after exposure to suitable actinic radiation; in two to nine seconds, in three to eight seconds, in four to seven seconds, and so on.

In yet other embodiments the composition of this invention undergoes mass polymerization when exposed to suitable UV irradiation at a temperature from 80° C. to 100° C. to form a substantially transparent film or an object.

In some embodiments the compounds of formula (VII) can be activated at certain wavelength of the electromagnetic radiation which can generally range from about 240 nm to 400 nm. Accordingly, any of the compounds which are active in this electromagnetic radiation can be employed in the compositions of this invention which are stable to the 3D fabrication methods. In some embodiments the wavelength of the radiation to activate the compounds of formula (VII) is 260 nm. In some other embodiments the wavelength of the radiation to activate the compounds of formula (VII) is 310 nm. In yet some other embodiments the wavelength of the radiation to activate the compounds of formula (VII) is 395 nm.

However, any of the other known photoactive compounds which can activate the latent organo-ruthenium compounds of formulae (II) employed herein can also be used in the composition of this invention. All such compounds are part of this invention.

Advantageously it has now been further found that employing one or more monomeric crosslinking agents in suitable quantities can dramatically enhance the mechanical properties of the resulting three dimensional objects formed from the compositions of this invention. Representative examples of such suitable monomeric crosslinkers can be selected from the group consisting of:

i) a compound of formula (VIIIa):

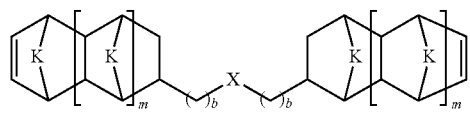

(VIIIa)

ii) a compound of formula (VIIIb):

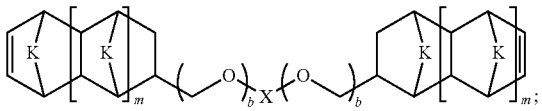

(VIIIb)

and iii) a compound of formula (VIIIc):

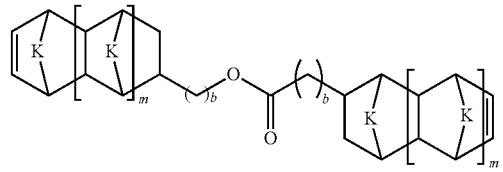

(VIIIc)

where m is an integer 0, 1 or 2;

b is an integer from 1 to 10;

K is selected from the group consisting of $CH_2$, $CH_2$—$CH_2$, O and S;

X is a bond or a moiety selected from the group consisting of O, S, $NR_a$, $SiR_bR_c$, $SiR_bR_cO(SiR_bR_cO)_nSiR_bR_c$, $SiR_bR_c(C_6\text{-}C_{10})$aryl$SiR_bR_c$, —C(O)—, —C(O)O—, —OC(O)—, —OC(O)—O—, —S—C(O)—, —C(O)—S—, —CH=CH— and —C≡C—;

$R_a$, $R_b$ and $R_c$ are independently of each other selected from the group consisting of hydrogen, methyl, ethyl or a linear or branched $(C_3\text{-}C_{12})$alkyl, $(C_3\text{-}C_8)$cycloalkyl, $(C_5\text{-}C_{12})$bicycloalkyl, $(C_5\text{-}C_{12})$bicycloalkenyl and $(C_5\text{-}C_{12})$bicycloalkenyl$(C_1\text{-}C_3)$alkylSi$(CH_3)_2$, and such that O, $NR_a$ and/or S atoms are not linked directly to one another; and n is an integer from 0 to 10.

Advantageously, it has now been found that incorporating one or more compounds of formulae (VIIIa), (VIIIb) or (VIIIc) it is possible to tailor the properties of the compositions for the intended purpose. For example, suitable combination of one or more compounds of formulae (VIIIa), (VIIIb) or (VIIIc) with the composition of this invention it is now possible to improve the mechanical properties of the articles formed from the composition of this invention among other properties. More particularly it has now been found that incorporation of certain siloxane compounds within the scope of compounds of formulae (VIIIa) or (VIIIb) improves the impact strength of the products formed therefrom. Any amount of one or more compounds of formula (VIIIa), (VIIIb) or (VIIIc) can be employed that would bring about the intended benefit. In general, such amounts may range from 0 to 20 mole percent of one or more compounds of formulae (VIIIa), (VIIIb) or (VIIIc) based upon the total moles of monomers of formula (I), in combination with one or more monomers of formulae (III) or (IV), if employed, and one or more compounds of formulae (VIIIa), (VIIIb) or (VIIIc). In some embodiments such amounts may range from 1 to 15 mole percent, and in some other embodiments such amounts may range from 0.5 to 10 mole percent, and yet in some other embodiments such amounts may range from 0.5 to 5 mole percent.

Accordingly, in some embodiments the impact strength of the polymers formed from the composition of this invention is at least 40 J/m. In some other embodiments the impact strength of the polymers formed from the composition of this invention is at least 60 J/m. In yet some other embodiments the impact strength of the polymers formed from the composition of this invention is at least 80 J/m, 100 J/m or higher, 140 J/m or higher or it can be higher than 160 J/m, such as for example higher than 170 J/m, higher than 180 J/m, higher than 200, 220 or 240 J/m, or even higher than 500, 550, 600, 700 or 800 J/m depending upon the types of monomers employed as described herein. In some embodiments the polymers formed from the composition of this invention comprising one or more monomers of formula (I) itself may exhibit such unusual impact strength which can range from 50 to 800 J/m.

In some embodiments the compounds of formulae (VIIIa), (VIIIb) or (VIIIc) are each having m=0 and K=CH$_2$. In some embodiments the compounds of formulae (VIIIa), (VIIIb) or (VIIIc) are each having m=1 and K=CH$_2$. In yet some other embodiments the compounds of formulae (VIIIa), (VIIIb) or (VIIIc) are each having m=2 and K=CH$_2$.

Representative examples of compounds within the scope of formulae (VIIIa) or (VIIIb) without any limitation includes the following:

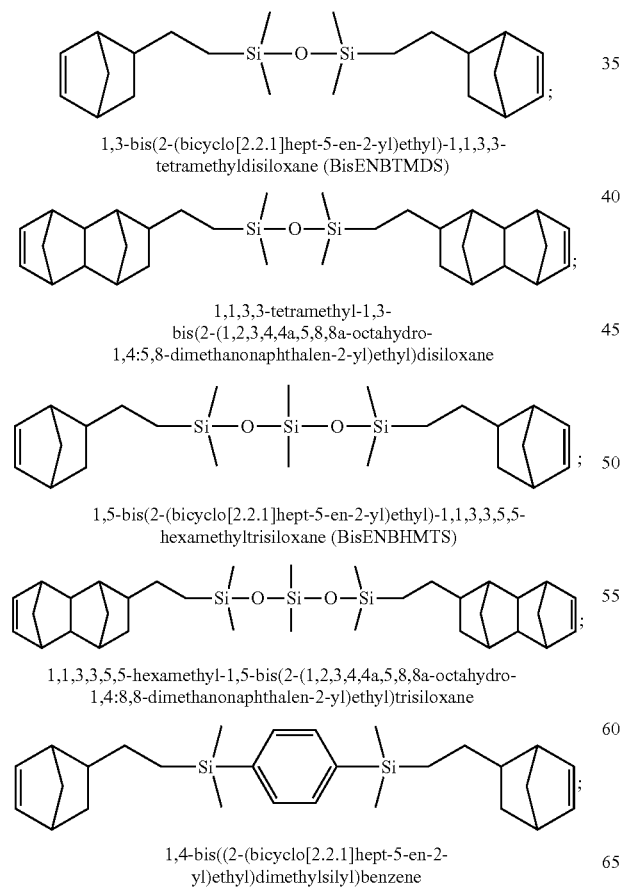

1,3-bis(2-(bicyclo[2.2.1]hept-5-en-2-yl)ethyl)-1,1,3,3-tetramethyldisiloxane (BisENBTMDS)

1,1,3,3-tetramethyl-1,3-bis(2-(1,2,3,4,4a,5,8,8a-octahydro-1,4:5,8-dimethanonaphthalen-2-yl)ethyl)disiloxane 1,5-bis(2-(bicyclo[2.2.1]hept-5-en-2-yl)ethyl)-1,1,3,3,5,5-hexamethyltrisiloxane (BisENBHMTS)

1,1,3,3,5,5-hexamethyl-1,5-bis(2-(1,2,3,4,4a,5,8,8a-octahydro-1,4:8,8-dimethanonaphthalen-2-yl)ethyl)trisiloxane 1,4-bis((2-(bicyclo[2.2.1]hept-5-en-2-yl)ethyl)dimethylsilyl)benzene

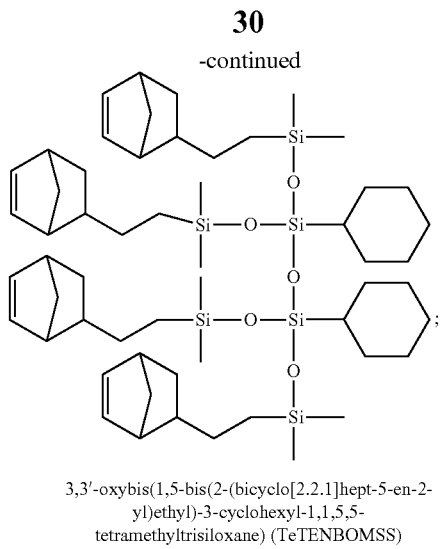

3,3'-oxybis(1,5-bis(2-(bicyclo[2.2.1]hept-5-en-2-yl)ethyl)-3-cyclohexyl-1,1,5,5-tetramethyltrisiloxane) (TeTENBOMSS)

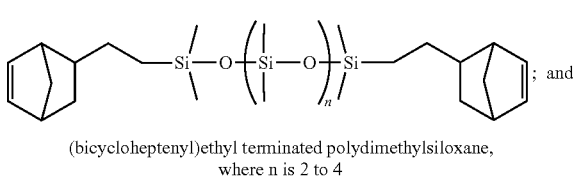

(bicycloheptenyl)ethyl terminated polydimethylsiloxane, where n is 2 to 4

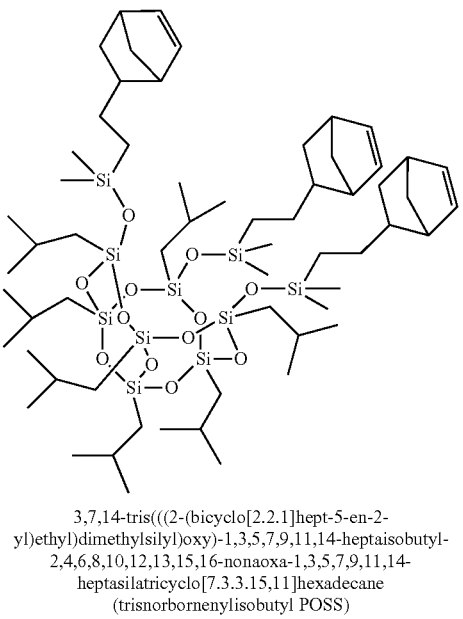

3,7,14-tris(((2-(bicyclo[2.2.1]hept-5-en-2-yl)ethyl)dimethylsilyl)oxy)-1,3,5,7,9,11,14-heptaisobutyl-2,4,6,8,10,12,13,15,16-nonaoxa-1,3,5,7,9,11,14-heptasilatricyclo[7.3.3.15,11]hexadecane (trisnorbornenylisobutyl POSS)

In addition, various other oligomeric or polymeric polysiloxanes with multi-functional cycloolefinic pendent groups are suitable as crosslinking molecules in the composition of this invention which may or may not be within the scope of compound of formula (IXa). Such examples include an oligomeric siloxane of the formula:

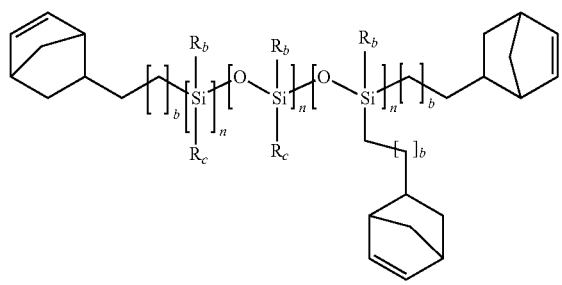

Where b is an integer from 1 to 9;
n is an integer from 1 to 10; and $R_b$ and $R_c$ are independently selected from the group consisting of methyl, ethyl, n-propyl, iso-propyl, n-butyl, isobutyl and phenyl.

Various other non-limiting examples of the compounds of formulae (VIIIa), (VIIIb) or (VIIIc) maybe selected from the group consisting of:

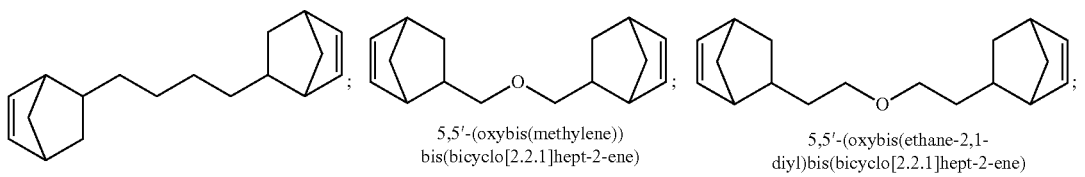

1,4-di(bicyclo[2.2.1]hept-5-en-2-yl)butane; 5,5′-(oxybis(methylene))bis(bicyclo[2.2.1]hept-2-ene); 5,5′-(oxybis(ethane-2,1-diyl)bis(bicyclo[2.2.1]hept-2-ene)

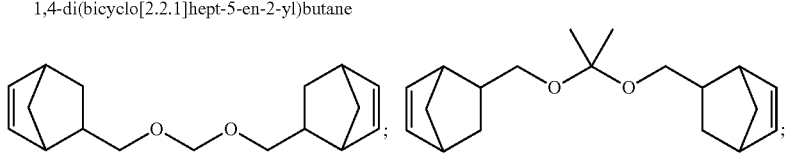

bis(bicyclo[2.2.1]hept-5-en-2-ylmethoxy)methane; 5,5′-((propane-2,2-diylbis(oxy))bis(methylene))bis(bicyclo[2.2.1]hept-2-ene)

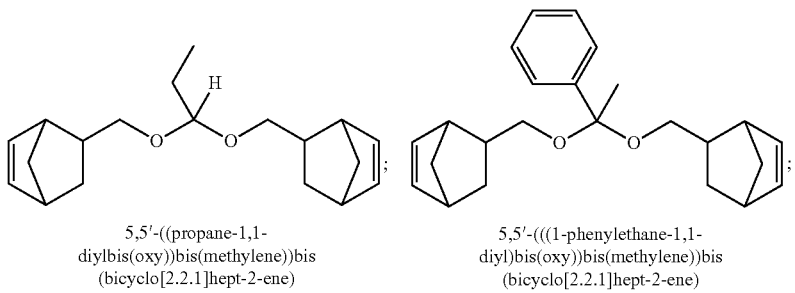

5,5′-((propane-1,1-diylbis(oxy))bis(methylene))bis(bicyclo[2.2.1]hept-2-ene); 5,5′-(((1-phenylethane-1,1-diyl)bis(oxy))bis(methylene))bis(bicyclo[2.2.1]hept-2-ene)

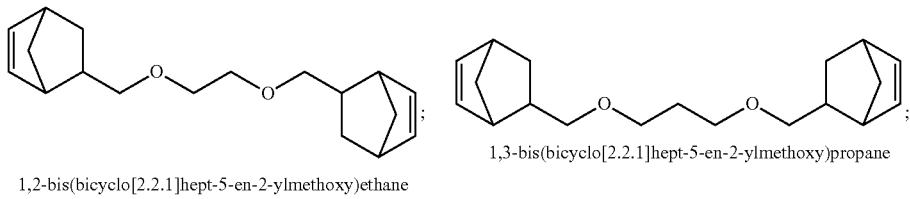

1,2-bis(bicyclo[2.2.1]hept-5-en-2-ylmethoxy)ethane; 1,3-bis(bicyclo[2.2.1]hept-5-en-2-ylmethoxy)propane

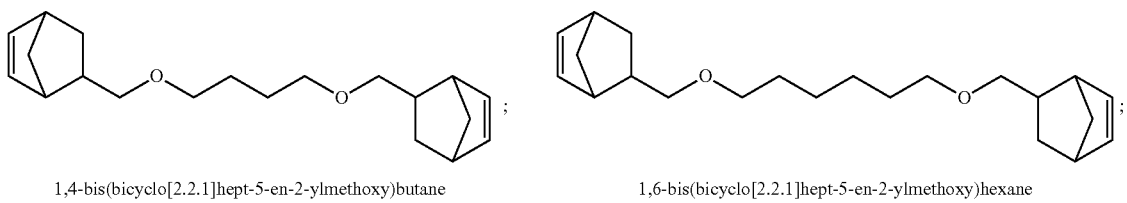

1,4-bis(bicyclo[2.2.1]hept-5-en-2-ylmethoxy)butane; 1,6-bis(bicyclo[2.2.1]hept-5-en-2-ylmethoxy)hexane

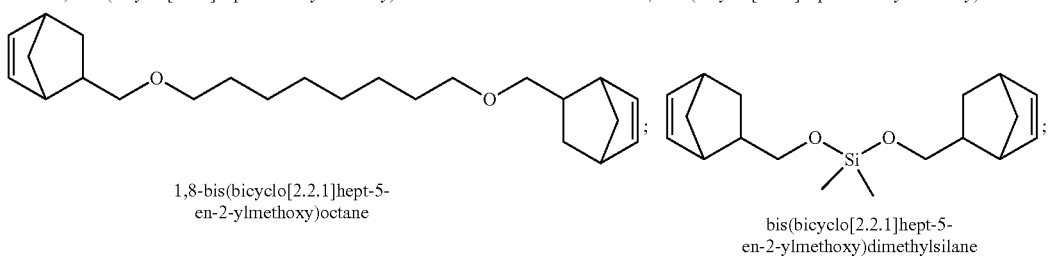

1,8-bis(bicyclo[2.2.1]hept-5-en-2-ylmethoxy)octane; bis(bicyclo[2.2.1]hept-5-en-2-ylmethoxy)dimethylsilane -continued
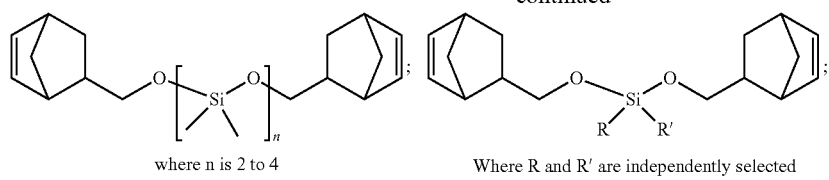
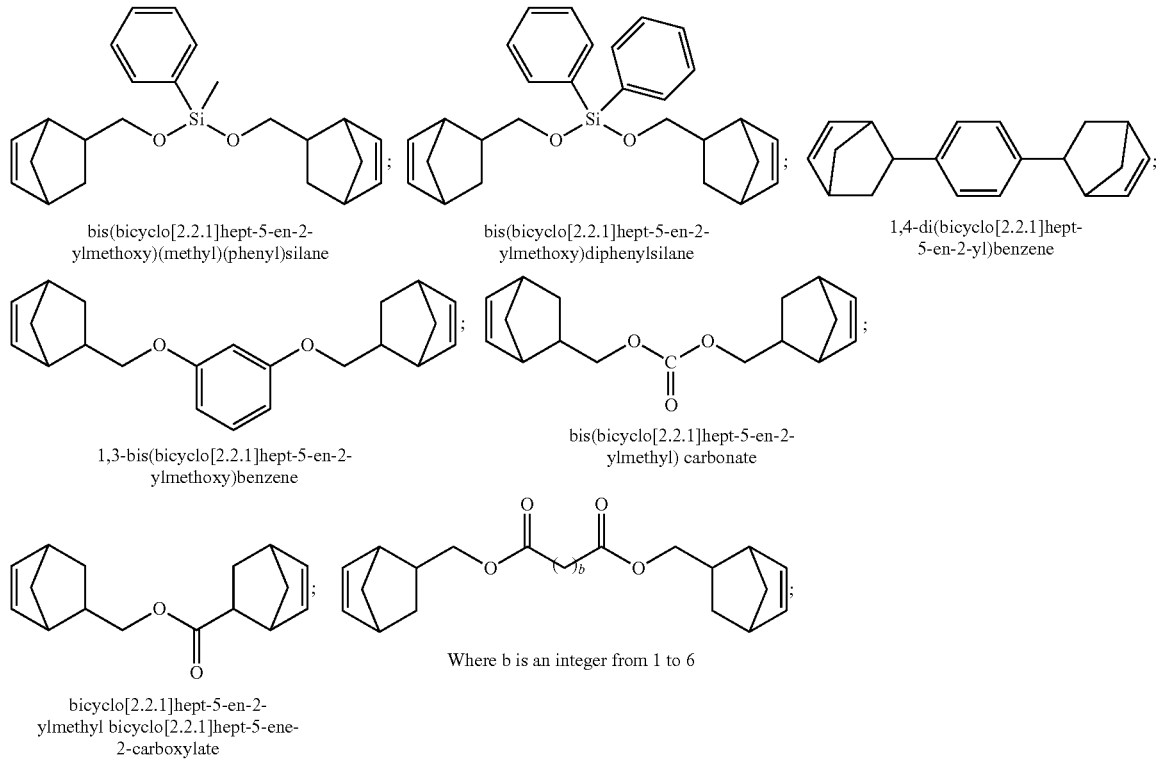
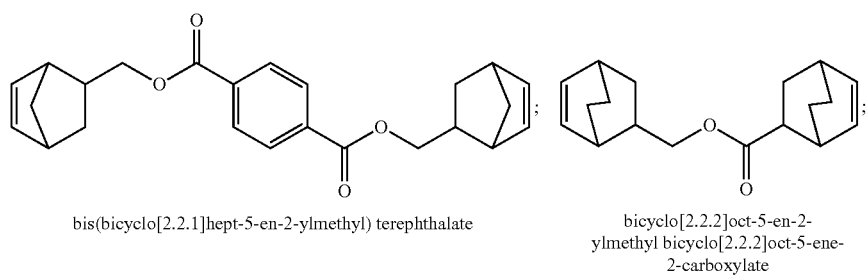
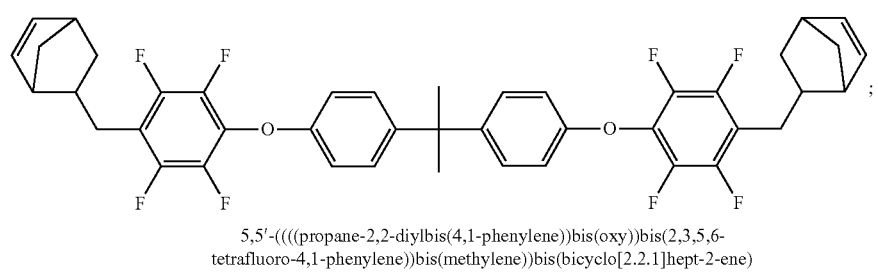

-continued

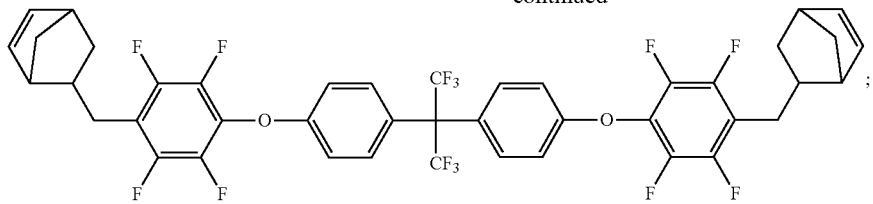

5,5'-(((((perfluoropropane-2,2-diyl)bis(4,1-phenylene))bis(oxy))bis(2,3,5,6-tetrafluoro-4,1-phenylene))bis(methylene)bis(bicyclo[2.2.1]hept-2-ene)

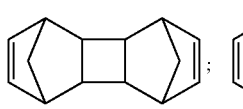 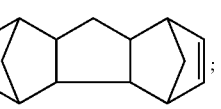 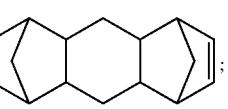 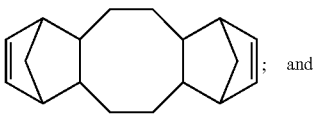

1,4,4a,4b,5,8,8a,8b-octahydro-1,4:5,8-dimethanobiphenylene 4,4a,4b,5,8,8a,9,9a-octahydro-1H-1,4:5,8-dimethanofluorene 1,4,4a,5,8,8a,9,9a,10,10a-decahydro-1,4:5,8-dimethanoanthracene 1,4,4a,5,6,6a,7,10,10a,11,12,12a-dodecahydro-1,4:7,10-dimethanodibenzo[a,e][8]annulene

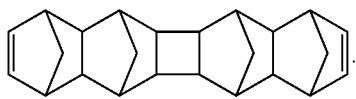

1,4,4a,5,5a,5b,6,6a,7,10,10a,11,11a,11b,12,12a-hexadecahydro-1,4:5,12:6,11:7,10-tetramethanodibenzo[b,h]biphenylene Various other non-limiting examples within the scope of the compounds of formula (VIIIa), (VIIIb) and (VIIIc) maybe enumerated as follows:

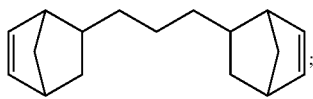

1,3-di(bicyclo[2.2.1]hept-5-en-2-yl)propane

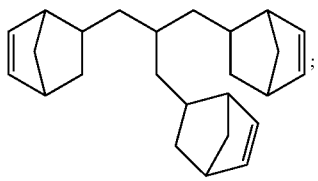

5,5'-(2-(bicyclo[2.2.1]hept-5-en-2-ylmethyl)propane-1,3-diyl)bis(bicyclo[2.2.1]hept-2-ene)

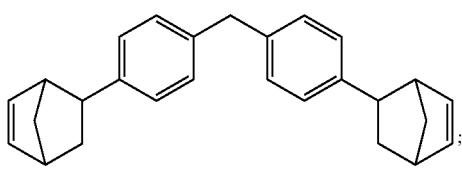

bis(4-(bicyclo[2.2.1]hept-2-en-2-yl)phenyl)methane

-continued

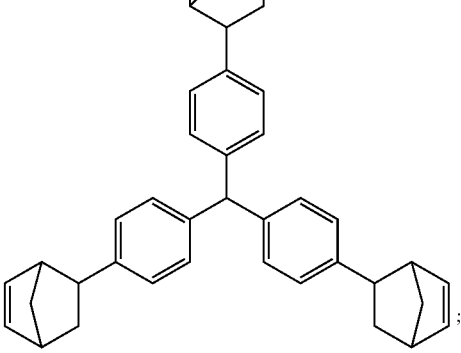

tris(4-(bicyclo[2.2.1]hept-5-en-2-yl)phenyl)methane

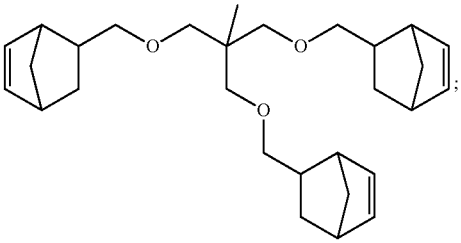

5,5'-(((2-((bicyclo[2.2.1]hept-5-en-2-ylmethoxy)methyl)-2-methylpropane-1,3-diyl)bis(oxy))bis(methylene))bis(bicyclo[2.2.1]hept-2-ene)

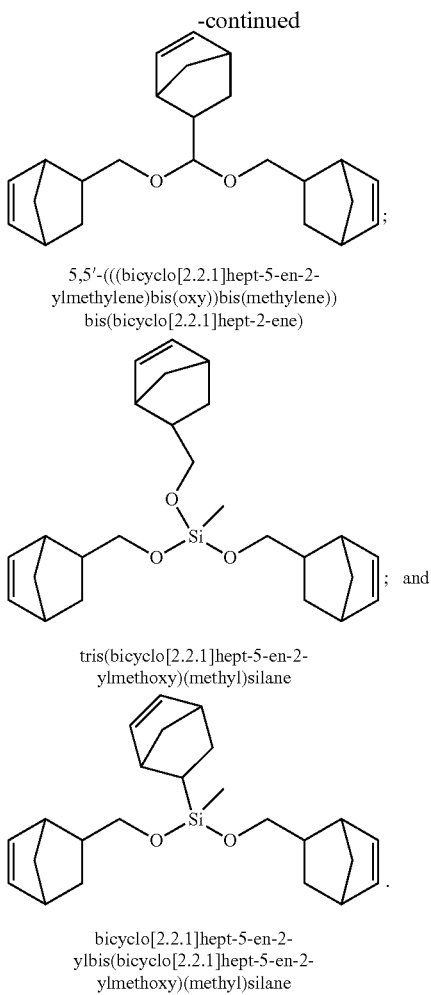

5,5'-(((bicyclo[2.2.1]hept-5-en-2-ylmethylene)bis(oxy))bis(methylene))bis(bicyclo[2.2.1]hept-2-ene)

tris(bicyclo[2.2.1]hept-5-en-2-ylmethoxy)(methyl)silane bicyclo[2.2.1]hept-5-en-2-ylbis(bicyclo[2.2.1]hept-5-en-2-ylmethoxy)(methyl)silane In some embodiments of this invention the composition of this invention may additionally contain other photosensitizer compounds which can activate the organo-ruthenium compounds of formulae (II) in order to facilitate the mass polymerization of the monomers of formula (I) and monomers of formulae (III) or (IV) if present. For this purpose, any suitable sensitizer compound can be employed in the compositions of the present invention. Such suitable sensitizer compounds include, photosensitizers, such as, anthracenes, phenanthrenes, chrysenes, benzpyrenes, fluoranthenes, rubrenes, pyrenes, xanthones, indanthrenes, and mixtures thereof. In some exemplary embodiments, suitable sensitizer components include mixtures thereof. Generally, the photosensitizers absorb energy from the radiated light source and transfers that energy to the desirable substrate/reactant employed in the composition of this invention.

The compositions in accordance with the present invention may further contain optional additives as may be useful for the purpose of improving properties of both the composition and the resulting object made therefrom. Such optional additives for example may include anti-oxidants and synergists, and the like.

In another embodiment of this invention, the composition of this invention encompasses a mixture of 2-hexyl-1,2,3,4,4a,5,8,8a-octahydro-1,4:5,8-dimethanonaphthalene (HexylTD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,6-diisopropylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-1).

In yet another embodiment of this invention, the composition of this invention encompasses a mixture of 2-hexyl-1,2,3,4,4a,5,8,8a-octahydro-1,4:5,8-dimethanonaphthalene (HexylTD), 2-phenethyl-1,2,3,4,4a,5,8,8a-octahydro-1,4:5,8-dimethanonaphthalene (PETD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,6-diisopropylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-1).

In yet another embodiment of this invention, the composition of this invention encompasses a mixture of 2-hexyl-1,2,3,4,4a,5,8,8a-octahydro-1,4:5,8-dimethanonaphthalene (HexylTD), 5-phenethylbicyclo[2.2.1]hept-2-ene (PENB), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,4,6-trimethylphenyl)-2-imidazolidinylidene]{2-[(E)-({2-[isopropylthio-κS]phenyl}imino-κN)methyl]phenoxido-κO}[2-(oxido-κO)benzylidene-κC]ruthenium(II) (Ru-2).

In yet another embodiment of this invention, the composition of this invention encompasses a mixture of 2-hexyl-1,2,3,4,4a,5,8,8a-octahydro-1,4:5,8-dimethanonaphthalene (HexylTD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,4,6-trimethylphenyl)-2-imidazolidinylidene]{2-[(E)-({2-[cyclohexylthio-κS]phenyl}imino-κN)methyl]phenoxido-κO}[2-(oxido-κO)benzylidene-κC]ruthenium(II) (Ru-3).

In yet another embodiment of this invention, the composition of this invention encompasses a mixture of 2-hexyl-1,2,3,4,4a,5,8,8a-octahydro-1,4:5,8-dimethanonaphthalene (HexylTD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-Bis(2,4,6-trimethylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-4).

In yet another embodiment of this invention, the composition of this invention encompasses a mixture of 2-phenethyl-1,2,3,4,4a,5,8,8a-octahydro-1,4:5,8-dimethanonaphthalene (PETD), 1,3-bis(2-(bicyclo[2.2.1]hept-5-en-2-yl)ethyl)-1,1,3,3-tetramethyldisiloxane (BisENBTMDS), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,6-diisopropylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-1).

In a further aspect of this invention there is provided a kit for forming a substantially transparent film. There is dispensed in this kit a composition of this invention. Accordingly, in some embodiments there is provided a kit in which there is dispensed one or more monomers of formula (I), an organo-ruthenium compound of formula (II) and a compound of formula (V), a compound of formula (VI) and a compound of formula (VII) and optionally one or more monomers of formulae (III) and/or (IV) and various other additives as described herein.

Accordingly, in some embodiments of this invention the kit according to this invention contains one or more monomers of formula (I), an organo-ruthenium compound of formula (II), a compound of formula (V), a compound of formula (VI) and a compound of formula (VII).

In yet some other embodiments the kit according to this invention contains one or more monomers of formula (I), an organo-ruthenium compound of formula (II), a compound of formula (V), a compound of formula (VI) and a compound of formula (VII) and one or more additives as described herein.

In some embodiments, the aforementioned kit encompasses two or more monomers of formula (I) distinct from one another as described hereinabove. In some other embodiments the kit of this invention encompasses at least two monomers wherein first monomer facilitates dissolution of the second monomer and/or the organo-ruthenium compound of formula (II) and the additives as described hereinabove. Any of the monomers of formula (I) as described herein can be used in this embodiment. The molar ratio of first and the second monomer of formula (I) contained in these components can vary and may range from 1:99 to 99:1, or 10:90 to 90:10, 20:80 to 80:20, 30:70 to 70:30, 60:40 to 40:60 or 50:50, and so on. In some other embodiments the kit may encompass a composition wherein dispensed more than two monomers of formula (I), each distinct from one another. Further, as noted the first monomer of formula (I) is completely soluble in the second monomer of formula (I) to form a clear solution at room temperature. In some embodiments the monomer mixture may become a clear solution at slightly elevated temperature, such as for example, 30° C. or 40° C. or 50° C.

In another aspect of this embodiment of this invention the composition of this invention undergoes mass polymerization when subjected to suitable radiation for a sufficient length of time to form a polymeric film or a solid object. That is to say that the composition of this invention is poured onto a surface or onto a substrate which needs to be encapsulated, and exposed to suitable radiation in order for the monomers to undergo polymerization to form a solid transparent polymer which could be in the form of a transparent film or a solid object. Generally, as already noted above, such polymerization can take place when exposed to actinic radiation at wavelengths ranging from about 240 nm to 410 nm. The compositions can also be subjected simultaneously to suitable radiation and heat to cause mass polymerization. By practice of this invention, it is now possible to obtain polymeric films on such substrates which are substantially transparent film or solid objects depending on the method of fabrication employed. The "substantially transparent film" as used herein means that the films formed from the composition of this invention are optically clear in the visible light. Accordingly, in some embodiments of this invention such films are having at least 90 percent of visible light transmission, in some other embodiments the films formed from the composition of this invention exhibit at least 95 percent of visible light transmission.

In some embodiments, the kit as described herein encompasses a composition, which contains any one of the mixtures as specifically enumerated above.

In yet another aspect of this invention there is further provided a method of forming a substantially transparent film for the fabrication of a variety of optoelectronic device comprising:

forming a homogeneous clear composition comprising one or more monomers of formula (I), an organo-ruthenium compound of formula (II), a compound of formula (V), a compound of formula (VI), a compound of formula (VII), and optionally one or more monomers of formula (III) or (IV) and one or more additives as described herein.

coating a suitable substrate with the composition or pouring the composition onto a suitable substrate to form a film; and either exposing the film to suitable radiation or heating the film to a suitable temperature to cause polymerization of the monomers.

The coating of the desired substrate to form a film with the composition of this invention can be performed by any of the coating or printing procedures as described herein and/or known to one skilled in the art, such as by spin coating. Other suitable coating methods include without any limitation spraying, doctor blading, meniscus coating, ink jet coating and slot coating. The composition can also be inkjet printed onto the substrate as is known in the art. The mixture can also be poured onto a substrate to form a film. Suitable substrate includes any appropriate substrate as is, or may be used for electrical, electronic or optoelectronic devices, for example, a semiconductor substrate, a ceramic substrate, a glass substrate.

Next, the coated substrate is exposed to suitable actinic radiation, i.e., exposed to radiation of wavelength ranging from 240 nm to 410 nm as described herein to facilitate the mass polymerization. In some embodiments the substrate is exposed to radiation and baked at a temperature of from about 40° C. to about 90° C. for about 2 minutes to 10 minutes. In some other embodiments the substrate is exposed to radiation and baked at a temperature of from about 60° C. to about 90° C. for 5 minutes to 20 minutes.

The films thus formed are then evaluated for their optical properties using any of the methods known in the art. For example, the refractive index of the film across the visible spectrum can be measured by ellipsometry. The optical quality of the film can be determined by visual observation. Quantitatively the percent transparency can be measured by visible spectroscopy. Generally, the films formed according to this invention exhibit excellent optical transparent properties and can be tailored to desirable refractive index as described herein.

Accordingly, in some of the embodiments of this invention there is also provided an optically transparent film obtained by the mass polymerization of the composition as described herein. In another embodiment there is also provided an optoelectronic device comprising the transparent film of this invention as described herein. The thickness of the transparent film can range anywhere between 0.5 µm and 100 µm, preferably between 1 m and 50 µm.

As noted, the compositions of this invention can be used in any of the known three dimensional (3D) printing technologies and other printing technologies. A few of the 3D printing procedures known in the art include continuous liquid interface production (CLIP), layer by layer approach (LBL), inkjet printing and frontal polymerization method, such as frontal ring open metathesis (FROMP) technique, see for example Robertson et al., Nature, Vol. 557, 223-227 (2018).

In a CLIP approach, a 3D object is continuously formed by projecting a continuous sequence of UV images (generated by a digital light-processing (DLP) imaging unit or a laser to generate the part) through an oxygen permeable, UV-transparent window below a liquid resin bath containing the compositions of this invention. The dead zone created above the window maintains a liquid interface below the advancing part. Above the dead zone, the curing part is continuously drawn out of the resin bath. The suction forces resulted due to this drawing replenishes the resin bath at the same time. In this way various parts of different dimensions up to several centimeters with part resolution lower than 100 microns can be fabricated.

In a 3D inkjet printing technology, the compositions of this invention can be used as photopolymerizable ink compositions to form lines and vias on a substrate, typically on a silicon wafer. A wide variety of parts having utility in electronic and optoelectronic applications can thus be manufactured using the compositions of this invention. Non limiting examples of such applications include manufacturing of OLED devices on a variety of substrates, which can be produced substantially in a particle free environment at high yields. The compositions of this invention may act as organic encapsulant layers and/or as filler materials in some of such OLED devices.

Accordingly, in yet another aspect of this invention there is further provided a method of forming a three dimensional object comprising:
providing a homogeneous clear composition in a suitable container blanketed with an inert atmosphere, the composition comprising one or more monomers of formula (I), at least one organo-ruthenium compound of formulae (II), a compound of formula (V), a compound of formula (VI), a compound of formula (VII), and optionally one or more monomers of formula (III) and/or one or more monomers of formula (IV) in combination with one or more additives as described herein;
exposing to suitable UV radiation while drawing the composition from the container; and
forming a three dimensional object.

Surprisingly, it has now been found that providing the composition in a suitable container blanketed with an inert atmosphere it is now possible to form 3D objects which are free of any voids and exhibiting excellent optical, thermal and mechanical properties. Such inert blanketed atmospheres can be achieved by using any of the inert gases which will bring about this effect. Non-limiting examples of such inert gases include nitrogen, helium, argon, and the like. In some embodiments the inert atmosphere used is by way purging with dry nitrogen.

Accordingly, the 3D objects formed in accordance with the method of this invention exhibit excellent optical, thermal and mechanical properties. In general, the properties of these objects can be tailored to intended end use. For example, the thermal properties of the 3D objects can be tailored to be stable up to 180° C. or higher depending upon the types of monomers of formula (I) in combination with monomers of formulae (III) or (IV), if employed, to form such 3D objects. Similarly, the mechanical properties can also be tailored to desired mechanical properties simply by the selection of suitable monomers as described herein. In general, by tailoring the proper choice of monomers the parts possessing very high impact strength can be fabricated. Most importantly the compositions of this invention are stable to 3D printing conditions and withstand the temperatures of up to 80° C. without any degradation and/or premature polymerization for several days ranging from about 5 to ten days, thus offering long shelf life stability, among other benefits. In some embodiments the composition of this invention is stable at 80° C. for at least 6 days. In some other embodiments the composition of this invention is stable at 50° C. for at least 10 days. In yet some other embodiments the composition of this invention is stable at 80° C. for at least 8 days.

Accordingly, in some of the embodiments of this invention there is also provided a three dimensional object comprising the composition of this invention which exhibits excellent optical, thermal and mechanical properties.

The compositions of this invention are also useful as protective layers in a variety of electronic or optoelectronic devices, particularly organic electronic devices, which are sensitive to environmental conditions, especially to oxygen and moisture. The compositions of this invention serve as such protective layers providing much needed protection against environmental conditions. Generally, in such applications, for example, an organic light emitting diode (OLED) devices, a plurality of layers of OLED or an OLED stack is formed on a suitable substrate, which is then encapsulated by the compositions of this invention.

The encapsulation of the OLED stack can be carried out by any of the known methods including but not limited to dip coating, inkjet coating, spin coating, and the like methods. Then the coated OLED stack is subjected to suitable actinic radiation so as to form a transparent polymeric layer on the OLED stack via ROMP. Before or after the transparent polymeric layer formation, a conducting layer is deposited on to the polymeric layer. Such conducting layers can be deposited by any of the known methods, such as for example, chemical vapor deposition (CVD) methods, among others. The polymeric layers formed from the compositions of this invention are stable to such CVD methods and retain their properties especially the transparent property, among other properties as described herein. Finally, the OLED device may optionally be protected by forming another polymeric layer by coating with the composition of this invention as described above and subjecting to suitable actinic radiation. Such stacking process can take plural processes of the transparent polymeric layer formation and/or the conducting layer deposition.

The following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

The following abbreviations have been used hereinbefore and hereafter in describing some of the compounds, instruments and/or methods employed to illustrate certain of the embodiments of this invention:

HexylTD—2-hexyl-1,2,3,4,4a,5,8,8a-octahydro-1,4:5,8-dimethanonaphthalene;

Ru-1—[1,3-bis(2,6-diisopropylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II);

CPTX—1-chloro-4-propoxy-9H-thioxanthen-9-one;
BTBBT—2,5-bis(5-(tert-butyl)benzo[d]oxazol-2-yl)thiophene;
Tinuvin 970, commercially available from Bodo Möller Chemie;
phr—parts per hundred parts of monomer.

Various monomers as used herein are either commercially available or can be readily prepared following the procedures as described in the co-pending U.S. Pat. No. 9,944,818.

The following Examples demonstrate that the compositions of this invention are quite stable at room temperature or at 60° C. for several days and can very readily be mass polymerized by subjecting to UV light and thereby forming desirable objects or as specified below.

Examples 1-3

Composition Preparation (Working Example 1 to 3, Comparative Example 1, Reference Example 1 to 3)

In glass brown bottles, CPTX (1.5 phr) was dissolved in HexylTD (10,000 molar parts) via sonication at 30° C. for 20 minutes to form a clear solution. The solution was purged with nitrogen for 8 hours. Ru-1 catalyst (1 molar part) was added in a glove box to the purged solution and sonicated for 30 minutes to completely dissolve the catalyst. The samples were checked optically for full dissolution and filtered prior to further experiments.

For the compositions that include any (c) compounds and/or (d) compound, the relative amount of HexylTD was reduced and the concentration of CPTX and Ru-1 was kept constant. Prepared compositions are described in Table 1. For example, the Working Example 3 composition has each respectively BTBBT and Tinuvin® 970 as 0.5 weight % and 2 weight % comparing to the whole weight of the Working Example 3 composition (100 weight %). Thin film preparation (Spincoating+UV curing)

Thin films of the compositions described in Table 1 were prepared by spincoating in a glovebox under nitrogen on pre-cleaned Quartz substrates. The wet film was illuminated with UV light of 395 nm to cure the film, the dose applied was in general between 1 and 5 J/cm$^2$, the exact dose used is summarized in Table 1. The spincoating parameters were optimized to obtain a cured film thickness of 8 μm. The film thickness was determined by profilometry after curing the film as the height difference between the film surface and the substrate surface (after scratching with a scalpel) with a stylus-type profilometer.
Transmission Spectra Transmission spectra were recorded with the cured thin films on the Quartz slides. Spectra were collected in the range 250-800 nm and are referenced to an empty Quartz slide. The optical properties of the films are summarized in Table 1. As UV curing dose, values of λ=395 nm [J/cm$^2$] are described in Table 1.

As can be seen from the data, films made by the composition which the (c) or (d) compound added to exhibit substantially no change in the transmission in the visible range. That is, all films show greater than 98% transmission in the 450-800 nm of the visible spectrum as evidenced in FIG. 1.

The films made by the composition which the (c) and (d) compound added to reduce the transmission in the UV light range. This shows that already these thin films of material can be used to protect an underlying layer from UV light. The curing of the film can be done with 395 nm light although some of the (c) and/or (d) compound shows substantive absorption around this wavelength. Transmittance spectra plots of Comparative Example 1 and Working Example 3 is shown in FIG. 1.
Curing Ratio Measurement The cured material was collected by scraping off the prepared film from the substrate and the material was analyzed by ATR-FTIR spectroscopy. The spectra were baseline corrected and normalized at the peak at 2851 cm$^{-1}$. The curing ratio was determined by integrating a monomer-specific vibration at 3058 cm$^{-1}$ and comparing it to the integral of the signal of the uncured formulation.

As can be seen from the results, although the combination of (c) compound and (d) compound reduces the transmission in the range of 250-400 nm, the curing ratio stays high (Working Examples 1-3). It's good to have high curing ratio in obtained film, because existence of HexylTD in the film can be decreased.

TABLE 1

| | (c), (d) compound, concentration [weight %] | UV Curing dose | Transmittance [%] | | | Curing ratio [%] |
|---|---|---|---|---|---|---|
| | | | Ave. 450-800 nm | Ave. 250-400 nm | 395 nm | |
| Comparative Example 1 | — | 5 | 99.1 | 96.5 | 98 | 99.2 |
| Reference Example 1 | 0.5% BTBBT | 1 | 98.8 | 67.6 | 56.9 | 96.3 |
| Reference Example 2 | 0.5% BTBBT | 2 | 98.8 | 68.3 | 58.1 | 97.6 |
| Reference Example 3 | 0.5% BTBBT | 5 | 98.8 | 68.9 | 59.4 | 98.8 |
| Working Example 1 | 0.5% BTBBT; 2% Tinuvin ® 970 | 1 | 98.7 | 28.6 | 25 | 95 |
| Working Example 2 | 0.5% BTBBT; 3% Tinuvin ® 970 | 2 | 98.8 | 28.7 | 25.1 | 96 |
| Working Example 3 | 0.5% BTBBT; 4% Tinuvin® 970 | 2 | 98.8 | 12.2 | 10.7 | 81 |

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A composition comprising:
   a) one or more monomers of formula (I):

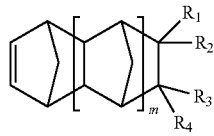

wherein:
   m is an integer 0, 1 or 2;
   $R_1$, $R_2$, $R_3$ and $R_4$ are the same or different and each independently selected from the group consisting of hydrogen, halogen, methyl, ethyl, linear or branched $(C_3-C_{16})$alkyl, perfluoro$(C_1-C_{12})$alkyl, hydroxy$(C_1-C_{16})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_6)$alkyl, tri$(C_1-C_6)$alkoxysilyl and a group of formula (A):

—Z-Aryl   (A)

wherein:
   Z is a bond or a group selected from the group consisting of:
   $(CR_5R_6)_a$, $O(CR_5R_6)_a$, $(CR_5R_6)_aO$, $(CR_5R_6)_a$—O—$(CR_5R_6)_b$, $(CR_5R_6)_a$—O—$(SiR_5R_6)_b$, $(CR_5R_6)_a$—(CO)O—$(CR_5R_6)_b$, $(CR_5R_6)_a$—O(CO)—$(CR_5R_6)_b$, $(CR_5R_6)_a$—(CO)—$(CR_5R_6)_b$, where a and b are integers which may be the same or different and each independently is 1 to 12;
   $R_5$ and $R_6$ are the same or different and each independently selected from the group consisting of hydrogen, methyl, ethyl, linear or branched $(C_3-C_6)$alkyl, hydroxy, methoxy, ethoxy, linear or branched $(C_3-C_6)$alkyloxy, acetoxy, $(C_2-C_6)$acyl, hydroxymethyl, hydroxyethyl, linear or branched hydroxy$(C_3-C_6)$alkyl, phenyl and phenoxy;
   Aryl is phenyl or phenyl substituted with one or more groups selected from the group consisting of methyl, ethyl, linear or branched $(C_3-C_6)$alkyl, hydroxy, methoxy, ethoxy, linear or branched $(C_3-C_6)$alkyloxy, acetoxy, $(C_2-C_6)$acyl, hydroxymethyl, hydroxyethyl, linear or branched hydroxy$(C_3-C_6)$alkyl, phenyl and phenoxy;

b) an organo-ruthenium compound of formula (II):

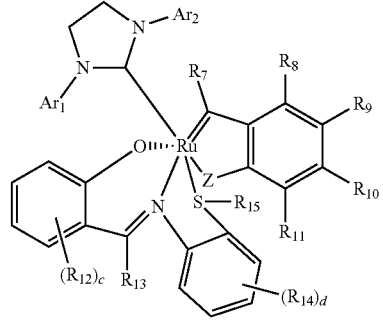

wherein
   c and d are integers from 0 to 5;
   Z is oxygen or sulfur;
   $R_7$ is selected from the group consisting of hydrogen, $(C_1-C_{20})$alkyl, $(C_2-C_{20})$alkenyl, $(C_2-C_{20})$alkynyl and $(C_6-C_{10})$aryl; and
   $R_8$, $R_9$, $R_{10}$ and $R_{11}$ are the same or different and each independently selected from the group consisting of hydrogen, halogen, $(C_1-C_{16})$alkyl, $(C_1-C_{16})$alkoxy, $(C_1-C_{16})$perfluoroalkyl, $(C_3-C_7)$cycloalkyl, $(C_2-C_{16})$alkenyl, $(C_6-C_{14})$aryl, $(C_6-C_{14})$perfluoroaryl, $(C_3-C_{12})$heterocyclyl, —$OR_{16}$, —$NO_2$, —COOH, —$COOR_{16}$, —$CONR_{16}R_{17}$, —$SO_2NR_{16}R_{17}$, —$SO_2R_{16}$, —CHO, —$COR_{16}$, wherein $R_{16}$ and $R_{17}$ are the same or different and each independently selected from the group consisting of $(C_1-C_6)$alkyl, $(C_1-C_6)$perfluoroalkyl, $(C_6-C_{14})$aryl, $(C_6-C_{14})$perfluoroaryl; or wherein
   two or more of $R_8$, $R_9$, $R_{10}$ and $R_{11}$ taken together with the carbon atoms to which they are attached to form a substituted or unsubstituted, fused $(C_4-C_8)$carbocyclic ring, or a substituted or unsubstituted, fused aromatic ring;
   each $R_{12}$, $R_{13}$ and $R_{14}$ may be the same or different and independently of the other selected from the group consisting of hydrogen, halogen, $(C_1-C_{16})$alkyl, $(C_1-C_{16})$alkoxy, $(C_1-C_{16})$perfluoroalkyl, $(C_3-C_7)$cycloalkyl, $(C_2-C_{16})$alkenyl, $(C_6-C_{14})$aryl, $(C_6-C_{14})$perfluoroaryl, $(C_3-C_{12})$heterocyclyl, —$OR_{16}$, —$NO_2$, —COOH, —$COOR_{16}$, —$CONR_{16}R_{17}$, —$SO_2NR_{16}R_{17}$, —$SO_2R_{16}$, —CHO, —$COR_{16}$, wherein $R_{16}$ and $R_{17}$ are the same or different and each independently selected from the group consisting of $(C_1-C_6)$alkyl, $(C_1-C_6)$perfluoroalkyl, $(C_6-C_{14})$aryl, $(C_6-C_{14})$perfluoroaryl;
   $R_{15}$ is selected from the group consisting of $(C_1-C_{16})$alkyl, $(C_1-C_{16})$perfluoroalkyl, $(C_3-C_{16})$cycloalkyl, $(C_6-C_{14})$aryl, $(C_6-C_{14})$perfluoroaryl and $(C_3-C_{12})$heterocyclyl;
   $Ar_1$ and $Ar_2$ are the same or different and each independently selected from the group consisting of substituted or unsubstituted phenyl, substituted or unsubstituted biphenyl and substituted or unsubstituted naphthyl, wherein each of said substituents are independently selected from the group consisting of methyl, ethyl and linear or branched $(C_3-C_6)$alkyl;

c) a compound of formula (V):

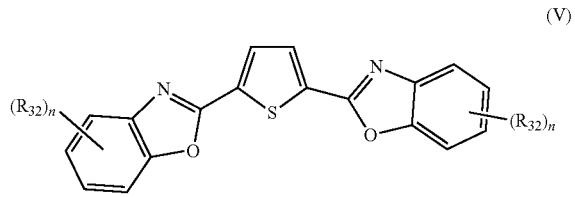

wherein
n is an integer from 0 to 4;
each $R_{32}$ is independently selected from the group consisting of hydrogen, methyl, ethyl, linear or branched $(C_3-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy $(C_1-C_3)$alkyl, and $(C_6-C_{10})$aryloxy;

d) a compound of formula (VI):

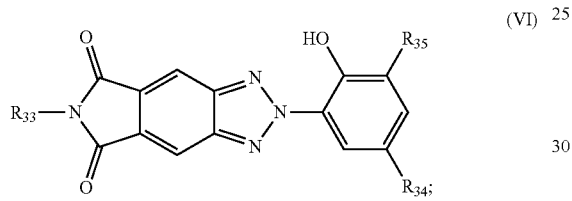

wherein
$R_{33}$ is selected from the group consisting of methyl, ethyl, linear or branched $(C_3-C_{12})$alkyl and $(C_3-C_{12})$cycloalkyl
each of $R_{34}$ and $R_{35}$ may be the same or different and independently selected from the group consisting of $(C_1-C_{10})$alkyl, $(C_6-C_{18})$aryl, $(C_6-C_{12})$aryl$(C_1-C_5)$alkyl and $(C_1-C_5)$alkyl$(C_6-C_{12})$aryl; where each of alkyl is independently linear or branched and optionally portions of methylene on the alkyl is replaced with a group selected from the group consisting of —CO—, —O—, or —COO—; and e) a photoactive compound of formula (VII):

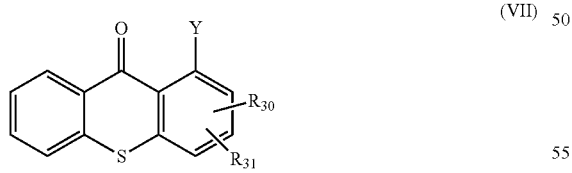

wherein
Y is halogen; and
$R_{30}$ and $R_{31}$ are the same or different and independently of each other selected from the group consisting of hydrogen, methyl, ethyl, linear or branched $(C_3-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy $(C_1-C_3)$alkyl and $(C_6-C_{10})$aryloxy.

2. The composition according to claim 1, wherein said composition comprises first and second monomer of formula (I) distinct from each other and one of said first and second monomers having a refractive index of at least 1.5 and viscosity below 100 centipoise at room temperature, and wherein said first monomer is completely miscible with said second monomer to form a clear solution.

3. The composition according to claim 1, wherein the monomer of formula (I) is selected from the group consisting of:

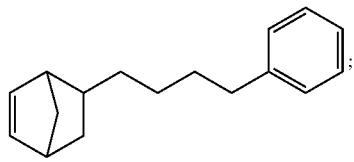

5-(4-phenylbutyl)bicyclo[2.2.1]hept-2-ene

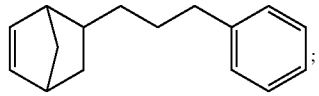

5-(3-phenylpropyl)bicyclo[2.2.1]hept-2-ene

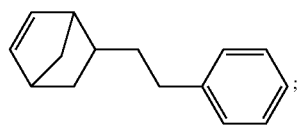

5-phenethylbicyclo[2.2.1]hept-2-ene (PENB)

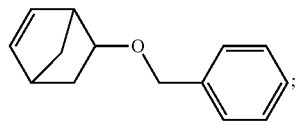

5-(benzyloxy)bicyclo[2.2.1]hept-2-ene

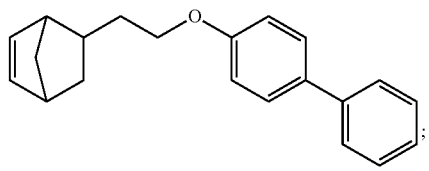

5-(2-([1,1'-biphenyl]-4-yloxy)ethyl)bicyclo[2.2.1]hept-2-ene

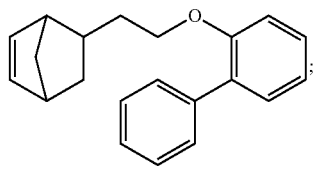

5-(2-([1,1'-biphenyl]-2-yloxy)ethyl)bicyclo[2.2.1]hept-2-ene (NBEtO-2-PhPh)

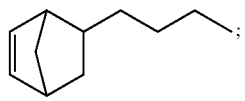

5-butylbicyclo[2.2.1]hept-2-ene (BuNB)

-continued

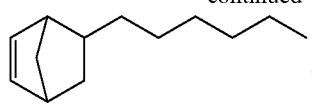

5-hexylbicyclo[2.2.1]hept-2-ene
(HexylNB)

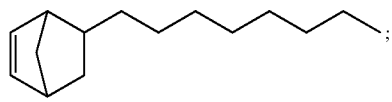

5-octylbicyclo[2.2.1]hept-2-ene (OctNB)

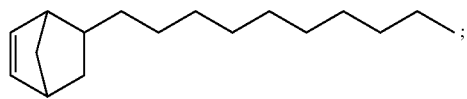

5-decylbicyclo[2.2.1]hept-2-ene (DecNB)

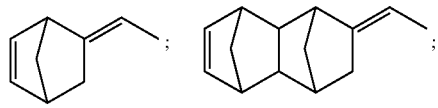

5-ethylidenebicyclo
[2.2.1]hept-2-ene 2-ethylidene-1,2,3,4,4a,5,8,
8a-octahydro-1,4:5,8-
dimethanonaphthalene

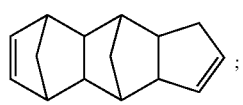

3a,4,4a,5,8,8a,9,9a-
octahydro-1H-4,9:5,8-
dimethanocyclopental[b]
naphthalene (one of
trimers of cyclopentadiene,
TCPD1, also known
as CPD3)

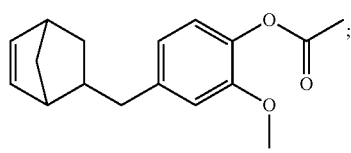

5-norbornenylmethyleugenyl acetate
(EuAcNB)

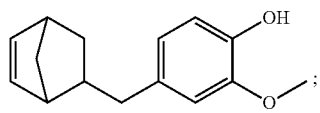

5-norbornenylmethyleugenol
(EuOHNB)

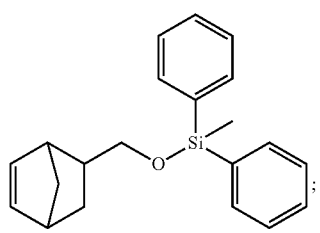

(bicyclo[2.2.1]hept-5-en-2-
ylmethoxy)(methyl)diphenylsilane
(NBCH$_2$OSiMePh$_2$)

-continued

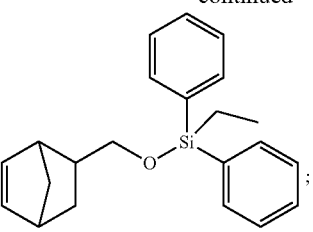

(bicyclo[2.2.1]hept-5-en-2-
ylmethoxy)ethyl)diphenylsilane

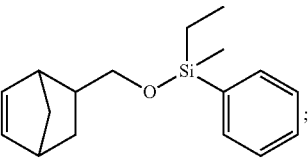

(bicyclo[2.2.1]hept-5-en-2-
ylmethoxy)ethyl)(methyl)
(phenyl)silane

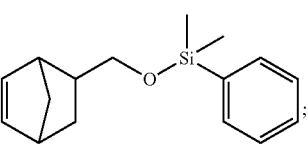

(bicyclo[2.2.1]hept-5-en-2-
ylmethoxy)dimethyl(phenyl)silane

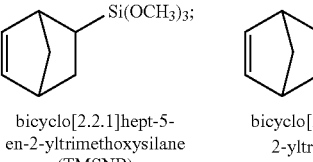

bicyclo[2.2.1]hept-5-
en-2-yltrimethoxysilane
(TMSNB)

bicyclo[2.2.1]hept-5-en-
2-yltriethoxysilane
(NBSi(OC$_2$H$_5$)$_3$)

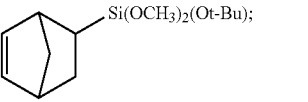

bicyclo[2.2.1]hept-5-en-2-
yl(tert-butoxy)dimethoxysilane

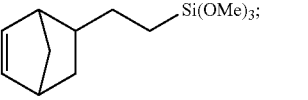

(2-(bicyclo[2.2.1]hept-5-en-2-
yl)ethyl)trimethoxysilane

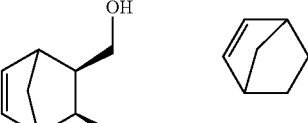 ; and 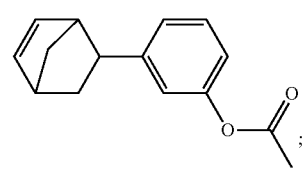

NB(MeOH)$_2$

PhAcNB

tetracyclododecene
(TD)

2-phenyl-tetracyclododecene
(PhTD)

-continued

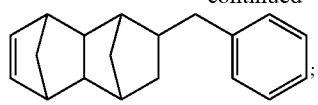

2-benzyl-1,2,3,4,4a,5,8,8a-
octahydro-1,4:5,8-
dimethanonaphthalene

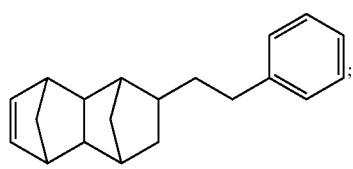

2-phenethyl-1,2,3,4,4a,5,8,8a-octahydro-
1,4:5,8-dimethanonaphthalene (PETD)

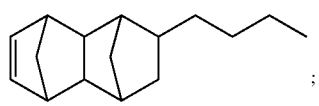

2-butyl-1,2,3,4,4a,5,8,8a-octahydro-
1,4:5,8-dimethanonaphthalene
(ButylTD)

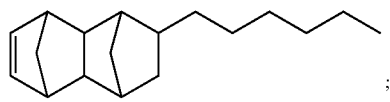

2-hexyl-1,2,3,4,4a,5,8,8a-octahydro-
1,4:5,8-dimethanonaphthalene (HexylTD)

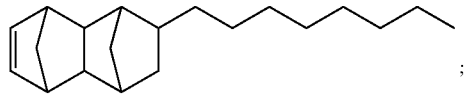

2-octyl-1,2,3,4,4a,5,8,8a-octahydro-1,4:5,8-
dimethanonaphthalene (OctylTD)

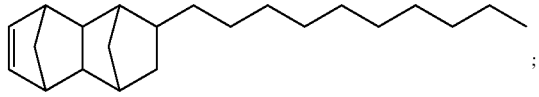

2-decyl-1,2,3,4,4a,5,8,8a-octahydro-1,4:5,8-dimethanonaphthalene
(DecylTD)

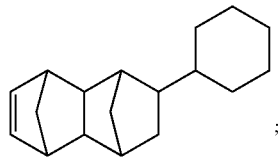

2-cyclohexyl-tetracyclododecene
(CylohexylTD)

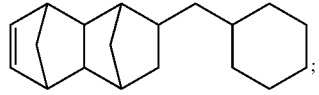

2-cyclohexylmethyl-1,2,3,4,4a,5,8,8a-
octahydro-1,4:5,8-
dimethanonaphthalene

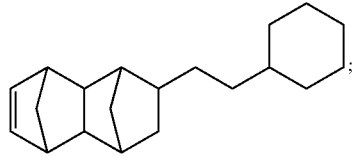

2-cyclohexylethyl-1,2,3,4,4a,5,8,8a-
octahydro-1,4:5,8-dimethanonaphthalene

-continued

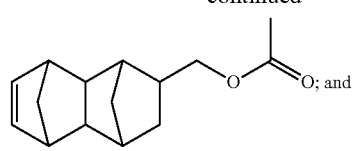

(1,2,3,4,4a,5,8,8a-octahydro-1,4:5,8-
dimethanonaphthalen-2-yl)
methyl acetate (TDMeOAc)

tetracyclododecadiene
(TDD)

4. The composition according to claim 1, wherein:

Z is oxygen;

$R_7$ is hydrogen;

$R_8$, $R_9$, $R_{10}$ and $R_{11}$ are the same or different and each independently selected from the group consisting of hydrogen, methyl, ethyl and —$NO_2$;

$R_{12}$, $R_{13}$ and $R_{14}$ are the same or different and each independently selected from the group consisting of hydrogen, methyl, ethyl and —$NO_2$;

$R_{15}$ is selected from the group consisting of methyl, ethyl and cyclohexyl;

$Ar_1$ and $Ar_2$ are the same or different and each independently selected from the group consisting of phenyl, 2,6-dimethylphenyl, 2,6-diethylphenyl, 2,6-di(isopropyl)phenyl and 2,4,6-trimethylphenyl.

5. The composition according to claim 1, wherein the organo-ruthenium compound of formula (II) is selected from the group consisting of:

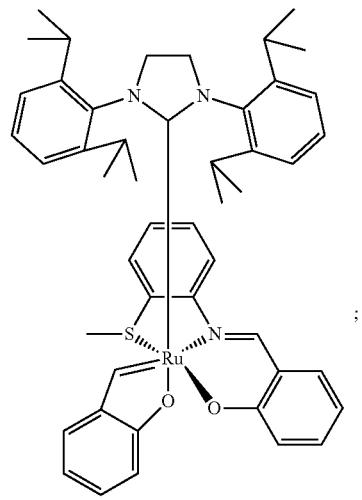

[1,3-Bis(2,6-diisopropylphenyl)-2-
imidazolidinylidene]{2-[(E)-({2-
[methylthio-κS]phenyl}imino-κN)
methyl]phenoxido-κO}[2-(oxido-κO)
benzylidene-κC]ruthenium(II) (Ru-1)

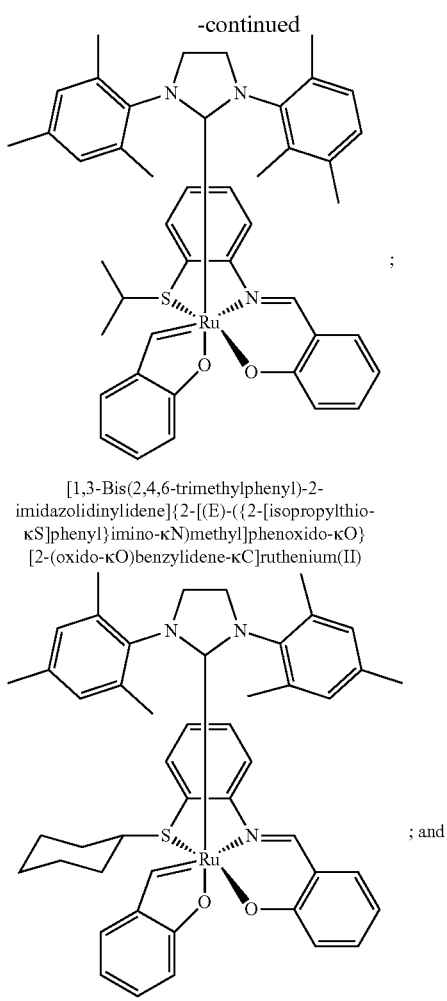

[1,3-Bis(2,4,6-trimethylphenyl)-2-imidazolidinylidene]{2-[(E)-({2-[isopropylthio-κS]phenyl}imino-κN)methyl]phenoxido-κO}[2-(oxido-κO)benzylidene-κC]ruthenium(II)

; and

[1,3-Bis(2,4,6-trimethylphenyl)-2-imidazolidinylidene]{2-[(E)-({2-[cyclohexylthio-κS]phenyl}imino-κN)methyl]phenoxido-κO}[2-(oxido-κO)benzylidene-κC]ruthenium(II)

.

[1,3-Bis(2,4,6-trimethylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II)

6. The composition according to claim 1, wherein the compound of formula (V) is selected from the group consisting of:

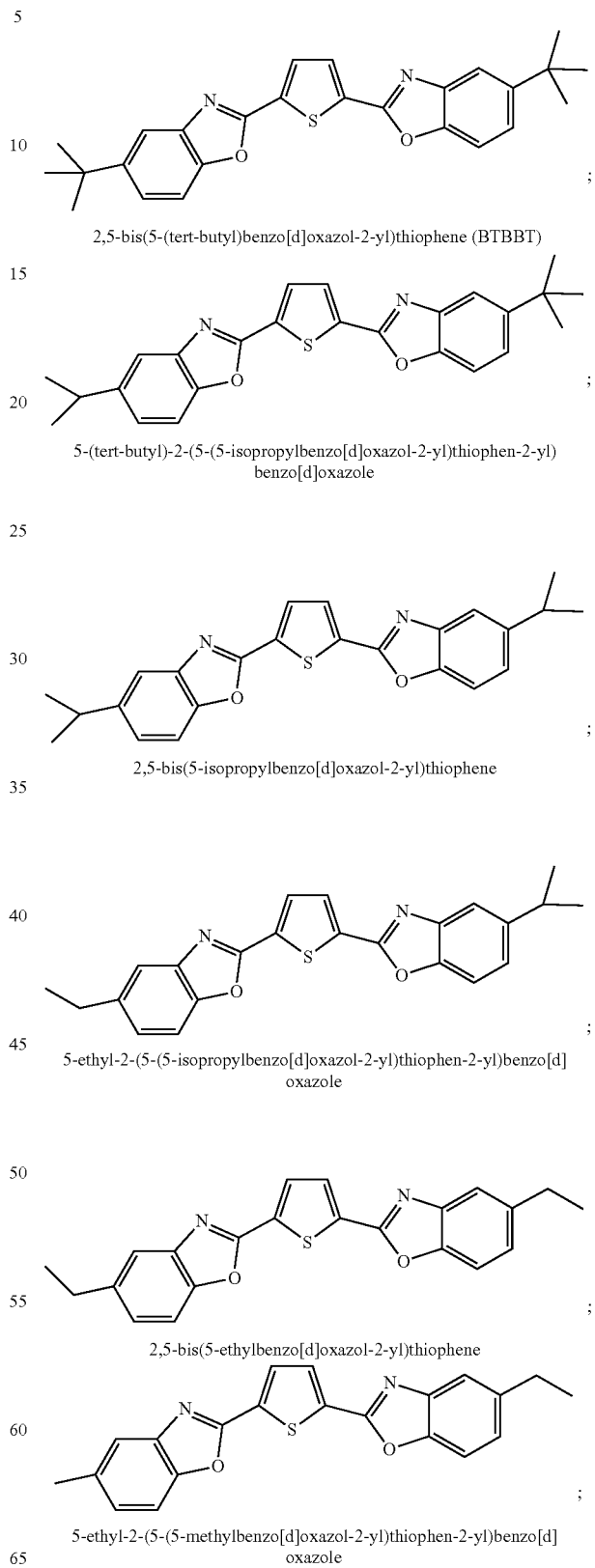

2,5-bis(5-(tert-butyl)benzo[d]oxazol-2-yl)thiophene (BTBBT)

;

5-(tert-butyl)-2-(5-(5-isopropylbenzo[d]oxazol-2-yl)thiophen-2-yl)benzo[d]oxazole

;

2,5-bis(5-isopropylbenzo[d]oxazol-2-yl)thiophene

;

5-ethyl-2-(5-(5-isopropylbenzo[d]oxazol-2-yl)thiophen-2-yl)benzo[d]oxazole

;

2,5-bis(5-ethylbenzo[d]oxazol-2-yl)thiophene

;

5-ethyl-2-(5-(5-methylbenzo[d]oxazol-2-yl)thiophen-2-yl)benzo[d]oxazole

-continued and

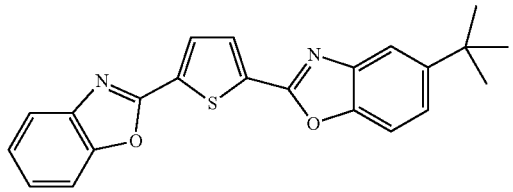

2-(5-(benzo[d]oxazol-2-yl)thiophen-2-yl)-5-(tert-butyl)benzo[d]oxazole

7. The composition according to claim 1, wherein the compound of formula (VI) is selected from the group consisting of:

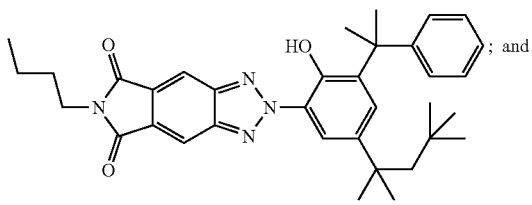

6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione

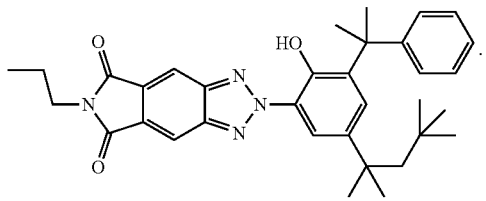

2-(2-hydroxy-3-(2-phenylpropan-2-yl)-5-(2,4,4-trimethylpentan-2-yl)phenyl)-6-propyl-[1,2,3]triazolo[4,5-f]isoindole-5,7(2H,6H)-dione 8. The composition according to claim 1, wherein:
Y is chlorine or bromine; and
$R_{30}$ and $R_{31}$ are the same or different and independently of each other selected from the group consisting of hydrogen, methyl, ethyl, n-propyl, iso-propyl, phenyl, cyclohexyl, methoxy, ethoxy, n-propoxy and phenoxy.

9. The composition according to claim 1, wherein the compound of formula (VII) is selected from the group consisting of:

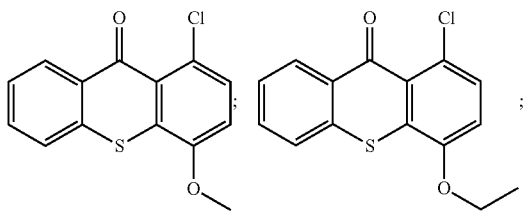

1-chloro-4-methoxy-9H-thioxanthen-9-one

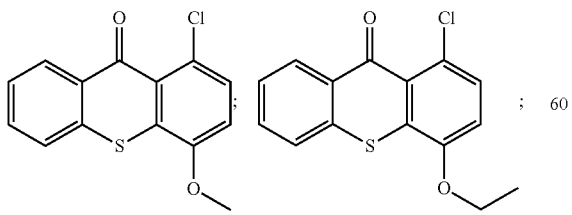

1-chloro-4-ethoxy-9H-thioxanthen-9-one

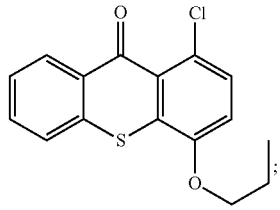

1-chloro-4-propoxy-9H-thioxanthen-9-one

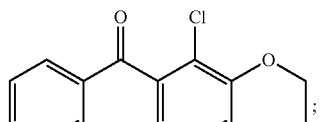

1-chloro-2-propoxy-9H-thioxanthen-9-one

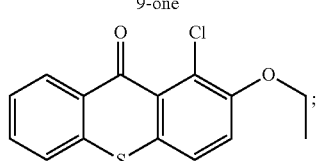

1-chloro-2-ethoxy-9H-thioxanthen-9-one

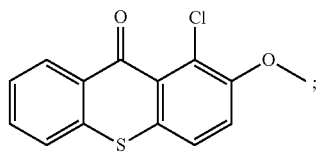

1-chloro-2-methoxy-9H-thioxanthen-9-one

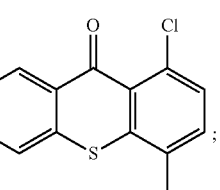

1-chloro-4-methyl-9H-thioxanthen-9-one ; 1-chloro-4-ethyl-9H-thioxanthen-9-one ;

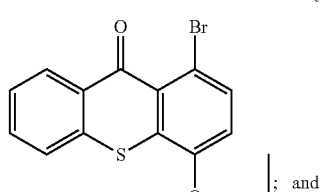

1-bromo-4-propoxy-9H-thioxanthen-9-one 1-chloro-4-phenoxy-9H-thioxanthen-9-one

10. The composition according to claim 1, which is selected from the group consisting of:

a mixture of 2-hexyl-1,2,3,4,4a,5,8,8a-octahydro-1,4:5,8-dimethanonaphthalene (HexylTD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,6-diisopropylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-1);

a mixture of 2-hexyl-1,2,3,4,4a,5,8,8a-octahydro-1,4:5,8-dimethanonaphthalene (HexylTD), 2-phenethyl-1,2,3,4,4a,5,8,8a-octahydro-1,4:5,8-dimethanonaphthalene (PETD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,6-diisopropylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-1);

a mixture of 2-hexyl-1,2,3,4,4a,5,8,8a-octahydro-1,4:5,8-dimethanonaphthalene (HexylTD), 5-phenethylbicyclo[2.2.1]hept-2-ene (PENB), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,4,6-trimethylphenyl)-2-imidazolidinylidene]{2-[(E)-({2-[isopropylthio-κS]phenyl}imino-κN)methyl]phenoxido-κO}[2-(oxido-κO)benzylidene-κC]ruthenium(II) (Ru-2);

a mixture of 2-hexyl-1,2,3,4,4a,5,8,8a-octahydro-1,4:5,8-dimethanonaphthalene (HexylTD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,4,6-trimethylphenyl)-2-imidazolidinylidene]{2-[(E)-({2-[cyclohexylthio-κS]phenyl}imino-κN)methyl]phenoxido-κO}[2-(oxido-κO)benzylidene-κC]ruthenium(II) (Ru-3);

a mixture of 2-hexyl-1,2,3,4,4a,5,8,8a-octahydro-1,4:5,8-dimethanonaphthalene (HexylTD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-Bis(2,4,6-trimethylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-4); and a mixture of 2-phenethyl-1,2,3,4,4a,5,8,8a-octahydro-1,4:5,8-dimethanonaphthalene (PETD), 1,3-bis(2-(bicyclo[2.2.1]hept-5-en-2-yl)ethyl)-1,1,3,3-tetramethyldisiloxane (BisENBTMDS), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,6-diisopropylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-1).

11. A process for encapsulating a device comprising:

providing a device;

coating said device with a composition according to claim 1;

exposing to suitable UV radiation; and encapsulating the device.

12. A kit for forming a substantially transparent film comprising:

a) one or more monomers of formula (I):

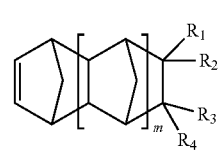

(I)

wherein:

m is an integer 0, 1 or 2;

$R_1$, $R_2$, $R_3$ and $R_4$ are the same or different and each independently selected from the group consisting of hydrogen, halogen, methyl, ethyl, linear or branched $(C_3-C_{16})$alkyl, perfluoro$(C_1-C_{12})$alkyl, hydroxy$(C_1-C_{16})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_3)$alkyl, tri$(C_1-C_6)$alkoxysilyl and a group of formula (A):

(A)

wherein:

Z is a bond or a group selected from the group consisting of:

$(CR_5R_6)_a$, $O(CR_5R_6)_a$, $(CR_5R_6)_aO$, $(CR_5R_6)_a$—O—$(CR_5R_6)_b$, $(CR_5R_6)_a$—O—$(SiR_5R_6)_b$, $(CR_5R_6)_a$—(CO)O—$(CR_5R_6)_b$, $(CR_5R_6)_a$—O(CO)—$(CR_5R_6)_b$, $(CR_5R_6)_a$—(CO)—$(CR_5R_6)_b$, where a and b are integers which may be the same or different and each independently is 1 to 12;

$R_5$ and $R_6$ are the same or different and each independently selected from the group consisting of hydrogen, methyl, ethyl, linear or branched $(C_3-C_6)$alkyl, hydroxy, methoxy, ethoxy, linear or branched $(C_3-C_6)$alkyloxy, acetoxy, $(C_2-C_6)$acyl, hydroxymethyl, hydroxyethyl, linear or branched hydroxy$(C_3-C_6)$alkyl, phenyl and phenoxy;

Aryl is phenyl or phenyl substituted with one or more of groups selected from the group consisting of methyl, ethyl, linear or branched $(C_3-C_6)$alkyl, hydroxy, methoxy, ethoxy, linear or branched $(C_3-C_6)$alkyloxy, acetoxy, $(C_2-C_6)$acyl, hydroxymethyl, hydroxyethyl, linear or branched hydroxy$(C_3-C_6)$alkyl, phenyl and phenoxy;

b) an organo-ruthenium compound of formula (II):

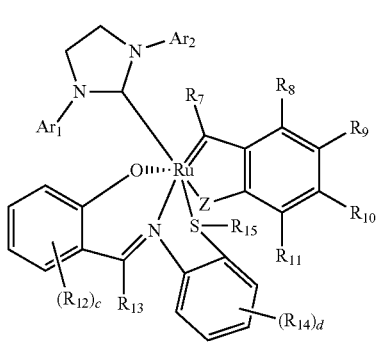

(II)

wherein c and d are integers from 0 to 5;

Z is oxygen or sulfur;

$R_7$ is selected from the group consisting of hydrogen, $(C_1-C_{20})$alkyl, $(C_2-C_{20})$alkenyl, $(C_2-C_{20})$alkynyl and $(C_6-C_{10})$aryl; and $R_8$, $R_9$, $R_{10}$ and $R_{11}$ are the same or different and each independently selected from the group consisting of hydrogen, halogen, $(C_1-C_{16})$alkyl, $(C_1-C_{16})$alkoxy, $(C_1-C_{16})$perfluoroalkyl, $(C_3-C_7)$cycloalkyl, $(C_2-C_{16})$alkenyl, $(C_6-C_{14})$aryl, $(C_6-C_{14})$perfluoroaryl, $(C_3-C_{12})$heterocyclyl, —$OR_{16}$, —$NO_2$, —COOH, —$COOR_{16}$, —$CONR_{16}R_{17}$, —$SO_2NR_{16}R_{17}$, —$SO_2R_{16}$, —CHO, —$COR_{16}$, wherein $R_{16}$ and $R_{17}$ are the same or different and each independently selected from the group consisting of $(C_1-C_6)$alkyl, $(C_1-C_6)$perfluoroalkyl, $(C_6-C_{14})$aryl, $(C_6-C_{14})$perfluoroaryl; or wherein two or more of $R_8$, $R_9$, $R_{10}$ and $R_{11}$ taken together with the carbon atoms to which they are attached to form a substituted or unsubstituted, fused $(C_4-C_8)$carbocyclic ring, or a substituted or unsubstituted, fused aromatic ring;

each $R_{12}$, $R_{13}$ and $R_{14}$ may be the same or different and independently of the other selected from the group consisting of hydrogen, halogen, $(C_1-C_{16})$alkyl, $(C_1-C_{16})$alkoxy, $(C_1-C_{16})$perfluoroalkyl, $(C_3-C_7)$cycloalkyl, $(C_2-C_{16})$alkenyl, $(C_6-C_{14})$aryl, $(C_6-C_{14})$perfluoroaryl, $(C_3-C_{12})$heterocyclyl, —$OR_{16}$, —$NO_2$, —COOH, —$COOR_{16}$, —$CONR_{16}R_{17}$, —$SO_2NR_{16}R_{17}$, —$SO_2R_{16}$, —CHO, —$COR_{16}$, wherein $R_{16}$ and $R_{17}$ are the same or different and each independently selected from the group consisting of $(C_1-C_6)$alkyl, $(C_1-C_6)$perfluoroalkyl, $(C_6-C_{14})$aryl, $(C_6-C_{14})$perfluoroaryl;

$R_{15}$ is selected from the group consisting of $(C_1-C_{16})$alkyl, $(C_1-C_{16})$perfluoroalkyl, $(C_3-C_{16})$cycloalkyl, $(C_6-C_{14})$aryl, $(C_6-C_{14})$perfluoroaryl and $(C_3-C_{12})$heterocyclyl;

$Ar_1$ and $Ar_2$ are the same or different and each independently selected from the group consisting of substituted or unsubstituted phenyl, substituted or unsubstituted biphenyl and substituted or unsubstituted naphthyl, wherein each of said substituents are independently selected from the group consisting of methyl, ethyl and linear or branched $(C_3-C_6)$alkyl; and c) a compound of formula (V):

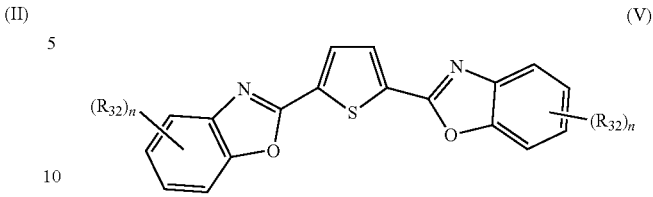

(V)

wherein n is an integer from 0 to 4;

each $R_{32}$ is independently selected from the group consisting of hydrogen, methyl, ethyl, linear or branched $(C_3-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl and $(C_6-C_{10})$aryloxy;

d) a compound of formula (VI):

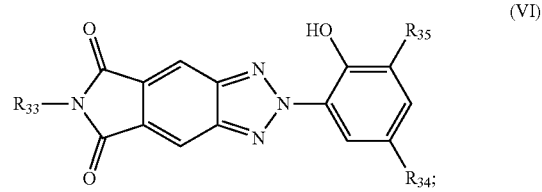

(VI)

wherein $R_{33}$ is selected from the group consisting of methyl, ethyl, linear or branched $(C_3-C_{12})$alkyl and $(C_3-C_{12})$cycloalkyl each of $R_{34}$ and $R_{35}$ may be the same or different and independently selected from the group consisting of $(C_1-C_{10})$alkyl, $(C_6-C_{18})$aryl, $(C_6-C_{12})$aryl$(C_1-C_5)$alkyl and $(C_1-C_5)$alkyl$(C_6-C_{12})$aryl; where each of alkyl is independently linear or branched and optionally portions of methylene on the alkyl is replaced with a group selected from the group consisting of —CO—, —O—, or —COO—; and e) a photoactive compound of formula (VII):

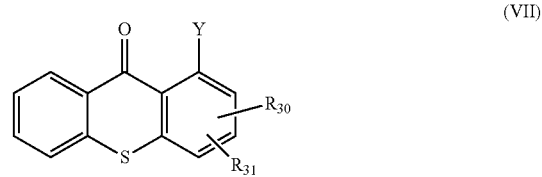

(VII)

wherein

Y is halogen; and $R_{30}$ and $R_{31}$ are the same or different and independently of each other selected from the group consisting of hydrogen, methyl, ethyl, linear or branched $(C_3-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl and $(C_6-C_{10})$aryloxy.

13. The kit according to claim 12, wherein the monomer of formula (I) is selected from the group consisting of:

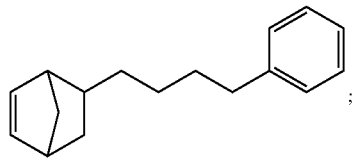

5-(4-phenylbutyl)bicyclo[2.2.1]hept-2-ene

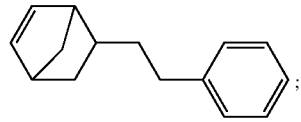

5-phenethylbicyclo[2.2.1]hept-2-ene
(PENB)

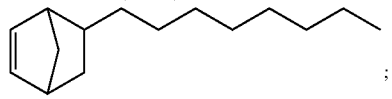

5-octylbicyclo[2.2.1]hept-2-ene (OctNB)

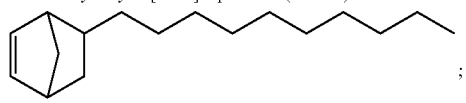

5-decylbicyclo[2.2.1]hept-2-ene (DecNB)

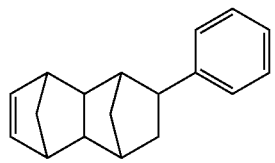

2-phenyl-tetracyclododecene
(PhTD)

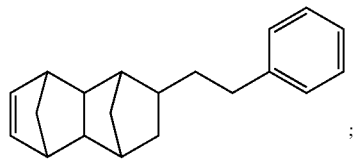

2-phenethyl-1,2,3,4,4a,5,8,8a-octahydro-
1,4:5,8-dimethanonaphthalene
(PETD)

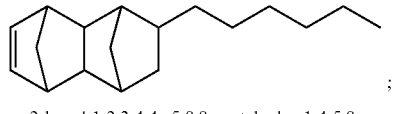

2-hexyl-1,2,3,4,4a,5,8,8a-octahydro-1,4:5,8-
dimethanonaphthalene
(HexylTD)

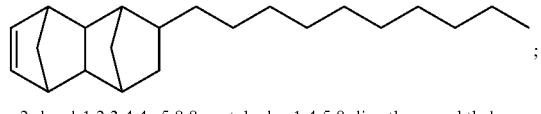

2-decyl-1,2,3,4,4a,5,8,8a-octahydro-1,4:5,8-dimethanonaphthalene
(DecylTD)

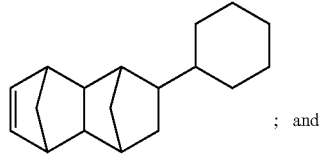

; and 2-cyclohexyl-tetracyclododecene
(CyclohexylTD)

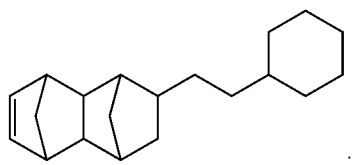

2-cyclohexylethyl-1,2,3,4,4a,5,8,8a-
octahydro-1,4:5,8-dimethanonaphthalene

14. The kit according to claim 12, wherein the organoruthenium compound of formula (II) is selected from the group consisting of:

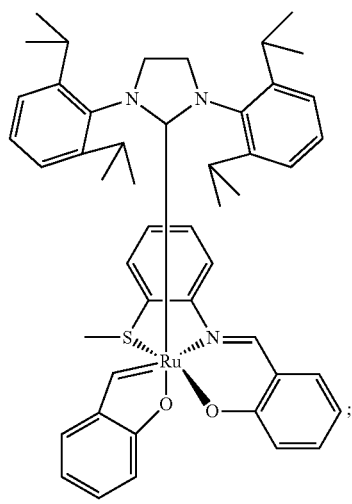

[1,3-Bis(2,6-diisopropylphenyl)-2-
imidazolidinylidene]{2-[(E)-({2-
[methylthio-κS]phenyl}imino-κN)
methyl]phenoxido-κO}[2-(oxido-κO)
benzylidene-κC]ruthenium(II) (Ru-1)

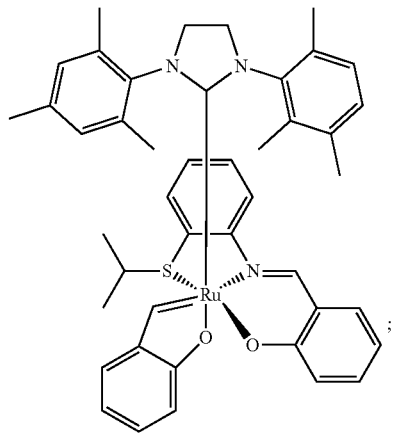

[1,3-Bis(2,4,6-trimethylphenyl)-2-
imidazolidinylidene]{2-[(E)-({2-[isopropylthio-
κS]phenyl}imino-κN)methyl]phenoxido-κO}
[2-(oxido-κO)benzylidene-κC]ruthenium(II);

-continued

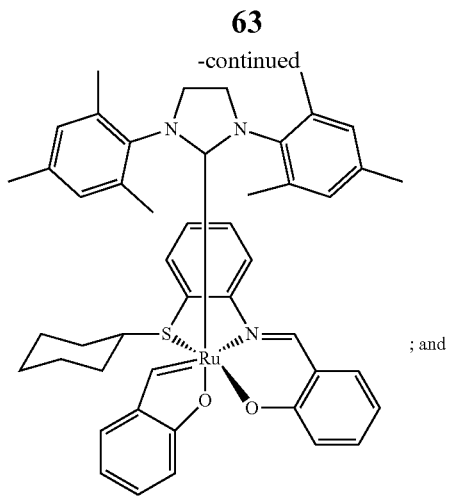

[1,3-Bis(2,4,6-trimethylphenyl)-2-
imidazolidinylidene]{2-[(E)-({2-[cyclohexylthio-κS]
phenyl}imino-κN)methyl]phenoxido-κO}[2-
(oxido-κO)benzylidene-κC]ruthenium(II)

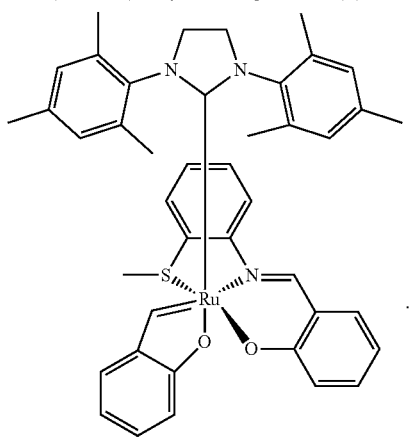

[1,3-Bis(2,4,6-trimethylphenyl)-2-
imidazolidinylidene]{2-[(E)-({2-
[methylthio-κS]phenyl}imino-κN)methyl]
phenoxido-κO}[2-(oxido-κO)
benzylidene-κC]ruthenium(II)

15. The kit according to claim 12, wherein the compound of formula (V) is selected from the group consisting of:

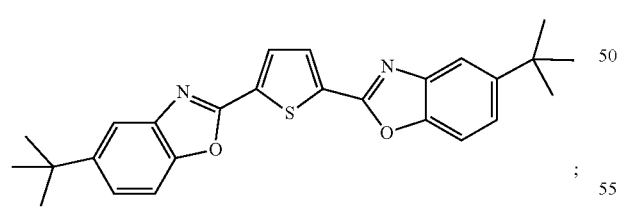

2,5-bis(5-(tert-butyl)benzo[d]oxazol-2-yl)thiophene (BTBBT)

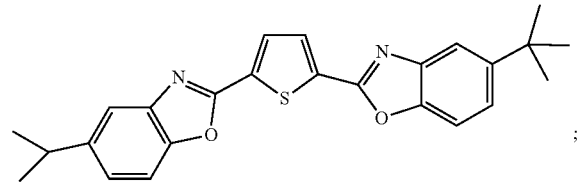

5-(tert-butyl)-2-(5-(5-isopropylbenzo[d]oxazol-2-yl)thiophen-2-yl)
benzo[d]oxazole -continued

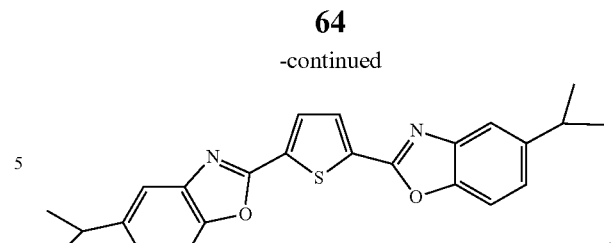

2,5-bis(5-isopropylbenzo[d]oxazol-2-yl)thiophene

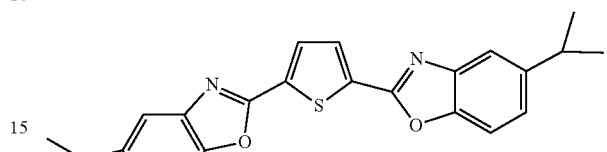

5-ethyl-2-(5-(5-isopropylbenzo[d]oxazol-2-yl)thiophen-2-yl)benzo[d]
oxazole

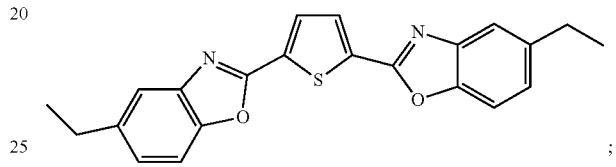

2,5-bis(5-ethylbenzo[d]oxazol-2-yl)thiophene

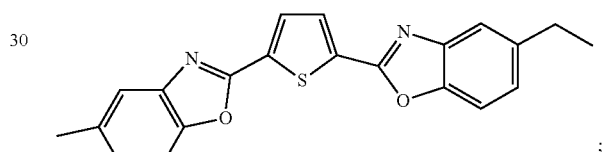

5-ethyl-2-(5-(5-methylbenzo[d]oxazol-2-yl)thiophen-2-yl)benzo[d]
oxazole and

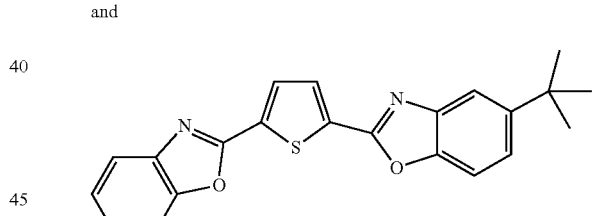

2-(5-(benzo[d]oxazol-2-yl)thiophen-2-yl)-5-(tert-butyl)benzo[d]
oxazole

16. The kit according to claim 12, wherein the compound of formula (VI) is selected from the group consisting of:

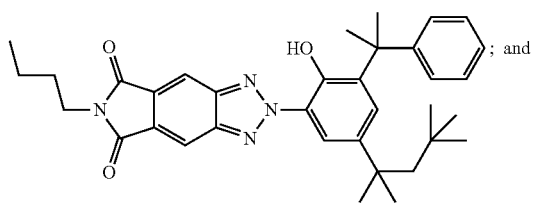

6-butyl-2-(2-hydroxy-3-(2-phenylpropan-2-yl)-
5-(2,4,4-trimethylpentan-2-yl)phenyl)-
[1,2,3]triazolo[4,5-f]isoindole-5,7(2H,6H)-dione -continued

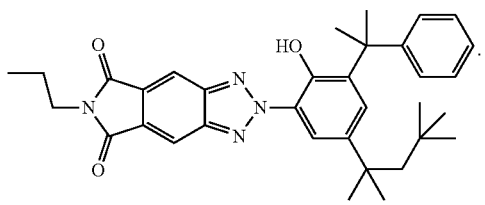

2-(2-hydroxy-3-(2-phenylpropan-2-yl)-5-
(2,4,4-trimethylpentan-2-yl)phenyl)-6-propyl-
[1,2,3]triazolo[4,5-f]isoindole-5,7(2H,6H)-dione 17. The kit according to claim 12, wherein the photoactive compound is selected from the group consisting of:

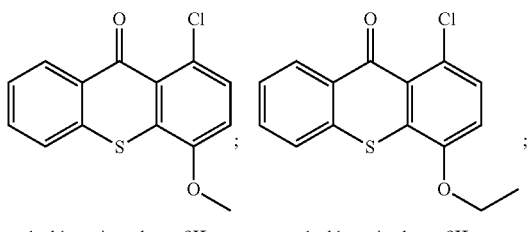

1-chloro-4-methoxy-9H-thioxanthen-9-one ; 1-chloro-4-ethoxy-9H-thioxanthen-9-one ;

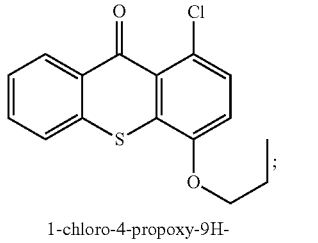

1-chloro-4-propoxy-9H-thioxanthen-9-one ;

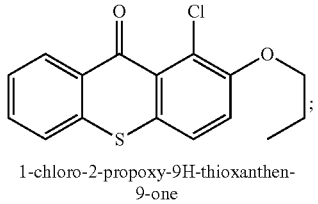

1-chloro-2-propoxy-9H-thioxanthen-9-one ;

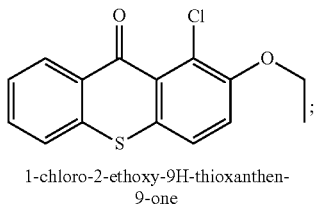

1-chloro-2-ethoxy-9H-thioxanthen-9-one ;

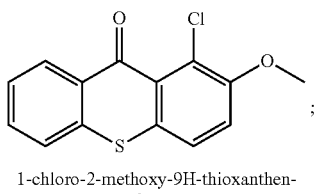

1-chloro-2-methoxy-9H-thioxanthen-9-one ;

-continued

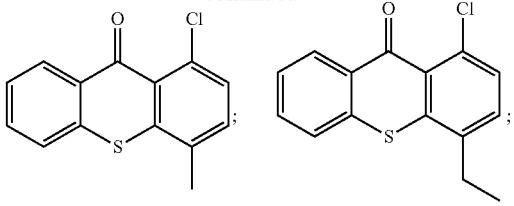

1-chloro-4-methyl-9H-thioxanthen-9-one ; 1-chloro-4-ethyl-9H-thioxanthen-9-one ;

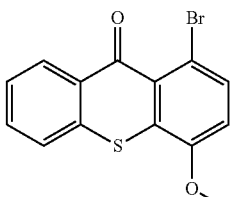

1-bromo-4-propoxy-9H-thioxanthen-9-one ; and

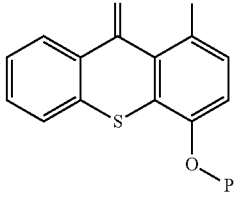

1-chloro-4-phenoxy-9H-thioxanthen-9-one .

18. The kit according to claim 12, which contains a mixture selected from the group consisting of:
a mixture of 2-hexyl-1,2,3,4,4a,5,8,8a-octahydro-1,4:5,8-dimethanonaphthalene (HexylTD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,6-diisopropylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-1);
a mixture of 2-hexyl-1,2,3,4,4a,5,8,8a-octahydro-1,4:5,8-dimethanonaphthalene (HexylTD), 2-phenethyl-1,2,3,4,4a,5,8,8a-octahydro-1,4:5,8-dimethanonaphthalene (PETD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,6-diisopropylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-1);
a mixture of 2-hexyl-1,2,3,4,4a,5,8,8a-octahydro-1,4:5,8-dimethanonaphthalene (HexylTD), 5-phenethylbicyclo[2.2.1]hept-2-ene (PENB), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,4,6-trimethylphenyl)-2-imidazolidinylidene]{2-

[(E)-({2-[isopropylthio-κS]phenyl}imino-κN)methyl]phenoxido-κO}[2-(oxido-κO)benzylidene-κC]ruthenium(II) (Ru-2);

a mixture of 2-hexyl-1,2,3,4,4a,5,8,8a-octahydro-1,4:5,8-dimethanonaphthalene (HexylTD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,4,6-trimethylphenyl)-2-imidazolidinylidene]{2-[(E)-({2-[cyclohexylthio-κS]phenyl}imino-κN)methyl]phenoxido-κO}[2-(oxido-κO)benzylidene-κC]ruthenium(II) (Ru-3);

a mixture of 2-hexyl-1,2,3,4,4a,5,8,8a-octahydro-1,4:5,8-dimethanonaphthalene (HexylTD), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-Bis(2,4,6-trimethylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-4); and a mixture of 2-phenethyl-1,2,3,4,4a,5,8,8a-octahydro-1,4:5,8-dimethanonaphthalene (PETD), 1,3-bis(2-(bicyclo[2.2.1]hept-5-en-2-yl)ethyl)-1,1,3,3-tetramethyldisiloxane (BisENBTMDS), 1-chloro-4-propoxy-9H-thioxanthen-9-one (CPTX), (2,5-bis(5-tert-butyl-benzoxazol-2-yl)thiophene (BTBBT), 6-butyl-2-(2-hydroxy-3-(2-phenylpropan-2-yl)-5-(2,4,4-trimethylpentan-2-yl)phenyl)-[1,2,3]triazolo[4,5-f]isoindole-5,7(2H,6H)-dione (Tinuvin 970) and [1,3-bis(2,6-diisopropylphenyl)-2-imidazolidinylidene]{2-[(E)-({2-[methylthio-κS]phenyl}imino-κN)methyl]phenoxido-κO}[2-(oxido-κO)benzylidene-κC]ruthenium(II) (Ru-1).

19. A film comprising the composition of claim 1.
20. A film formed from the kit of claim 12.

* * * * *